(12) United States Patent
An

(10) Patent No.: US 12,527,115 B2
(45) Date of Patent: Jan. 13, 2026

(54) METHOD OF MANUFACTURING DISPLAY DEVICE

(71) Applicant: LG Display Co., Ltd., Seoul (KR)

(72) Inventor: Chung Hwan An, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 800 days.

(21) Appl. No.: 17/777,136

(22) PCT Filed: May 27, 2020

(86) PCT No.: PCT/KR2020/006820
§ 371 (c)(1),
(2) Date: May 16, 2022

(87) PCT Pub. No.: WO2021/132816
PCT Pub. Date: Jul. 1, 2021

(65) Prior Publication Data
US 2022/0399473 A1 Dec. 15, 2022

(30) Foreign Application Priority Data
Dec. 23, 2019 (KR) .......................... 10-2019-0172912

(51) Int. Cl.
*H10H 20/01* (2025.01)
*H01L 21/68* (2006.01)
*H01L 25/075* (2006.01)

(52) U.S. Cl.
CPC ............. *H10H 20/01* (2025.01); *H01L 21/68* (2013.01); *H01L 25/0753* (2013.01)

(58) Field of Classification Search
None
See application file for complete search history.

(56) References Cited

U.S. PATENT DOCUMENTS

| 10,074,636 B2 | 9/2018 | Yoo et al. |
| 2018/0190672 A1 | 7/2018 | Lee et al. |
| 2019/0035817 A1 | 1/2019 | Park |
| 2019/0157501 A1 | 5/2019 | An |

FOREIGN PATENT DOCUMENTS

| KR | 10-2018-0080091 B1 | 7/2018 | |
| KR | 10-1902566 B1 | 9/2018 | |
| KR | 101953797 * | 2/2019 | ........... H01L 27/156 |
| KR | 10-1953797 B1 | 3/2019 | |
| KR | 10-1956231 B1 | 3/2019 | |
| KR | 10-2019-0099164 A | 8/2019 | |

* cited by examiner

*Primary Examiner* — Wael M Fahmy
(74) *Attorney, Agent, or Firm* — Birch, Stewart, Kolasch & Birch, LLP

(57) ABSTRACT

One aspect of the present disclosure provides a method of manufacturing a display device, including: a process of aligning a first wafer on which a plurality of first LEDs, a plurality of alignment keys, and a reference member are disposed with a donor substrate; a process of transferring the plurality of first LEDs and the reference member on the first wafer to the donor substrate; and a process of aligning a second wafer on which a plurality of second LEDs is disposed with the donor substrate based on the reference member. Therefore, a relative position between the plurality of second LEDs of the second wafer and the plurality of first LEDs of the donor substrate may be precisely aligned based on the reference member that maintains a predetermined interval from the plurality of first LEDs.

17 Claims, 28 Drawing Sheets

METHOD OF MANUFACTURING DISPLAY DEVICE

CROSS REFERENCE TO RELATED APPLICATIONS

This Application is the National Stage filing under 35 U.S.C. 371 of International Application No. PCT/KR2020/006820, filed on Mar. 27, 2020, which claims priority under 35 U.S.C. § 119(a) to Patent Application No. 10-2019-0172912, filed in the Republic of Korea on Dec. 23, 2019, the entire contents of all these applications being hereby expressly incorporated by reference into the present application.

TECHNICAL FIELD

The present disclosure relates to a method of manufacturing a display device, and more particularly, to a method of manufacturing a display device with improved alignment accuracy of a plurality of light emitting diodes (LEDs).

BACKGROUND ART

Display devices used for a computer monitor, a TV, a mobile phone, etc. include an organic light emitting display (OLED) device that emits light by itself, a liquid crystal display (LCD) device that requires a separate light source, etc.

As the display devices have been increasingly applied to diverse fields such as a computer monitor, a TV, and a personal mobile device, display devices having a large display area and a reduced volume and weight have been studied.

In addition, in recent years, a display device including an LED has attracted attention as a next generation display device. The LED may be made of an inorganic material, not an organic material, and thus may have excellent reliability and a longer lifetime than a liquid crystal display device or an organic light emitting display device. Further, the LED may have a fast-emitting speed as well as excellent luminous efficiency, excellent impact resistance, excellent stability, and the ability to display a high-brightness image.

DISCLOSURE

Technical Problem

The present disclosure is directed to providing a method of manufacturing a display device with improved alignment accuracy of a plurality of LEDs in a primary transfer process of transferring the plurality of LEDs to a donor substrate from a wafer and a secondary transfer process of transferring the plurality of LEDs to a display panel from the donor substrate.

Also, the present disclosure is directed to providing a method of manufacturing a display device with improved alignment accuracy of a plurality of LEDs without limitation to the size of the plurality of LEDs.

Further, the present disclosure is directed to providing a method of manufacturing a display device with a high resolution.

Furthermore, the present disclosure is directed to providing a method of manufacturing a display device with reduced process time and cost by simplifying a transfer process of an alignment key during a primary transfer process.

Moreover, the present disclosure is directed to providing a method of manufacturing a display device with reduced process time and cost by shortening a secondary transfer process in which a red LED, a green LED and a blue LED respectively corresponding to a plurality of sub-pixels are transferred to a display panel at a time.

Besides, the present disclosure is directed to providing a method of manufacturing a display device with improved productivity and yield by simplifying a primary transfer process and a secondary transfer process and precisely aligning a plurality of LEDs.

Object of the present disclosure are not limited to the above-mentioned objects, and other objects, which are not mentioned above, can be clearly understood by those skilled in the art from the following descriptions.

Technical Solution

One aspect of the present disclosure provides a method of manufacturing a display device, including: a process of aligning a first wafer on which a plurality of first LEDs, a plurality of alignment keys, and a reference member are disposed with a donor substrate; a process of transferring the plurality of first LEDs and the reference member on the first wafer to the donor substrate; and a process of aligning a second wafer on which a plurality of second LEDs is disposed with the donor substrate based on the reference member. Therefore, a relative position between the plurality of second LEDs of the second wafer and the plurality of first LEDs of the donor substrate may be precisely aligned based on the reference member that maintains a predetermined interval from the plurality of first LEDs.

Another aspect of the present disclosure provides a method of manufacturing a display device, including: a process of aligning a first wafer on which a reference member and a plurality of first LEDs are disposed with a donor substrate; a process of transferring the plurality of first LEDs and the reference member of the first wafer to the donor substrate; a process of aligning a second wafer on which a plurality of second LEDs is disposed with the donor substrate based on the reference member transferred onto the donor substrate; a process of transferring the plurality of second LEDs of the second wafer to the donor substrate; a process of aligning a third wafer on which a plurality of third LEDs is disposed with the donor substrate based on the reference member transferred onto the donor substrate; and a process of transferring the plurality of third LEDs of the third wafer to the donor substrate. Therefore, a decrease in alignment accuracy of a plurality of LEDs caused by an alignment error in the process may be minimized by aligning the second wafer and the third wafer based on the reference member first transferred onto the donor substrate.

Other detailed matters of the exemplary embodiments are included in the detailed description and the drawings.

Advantageous Effects

According to the present disclosure, a relative position of a plurality of LEDs is aligned during a first transfer. Thus, an interval between the plurality of LEDs can be precisely aligned so that the plurality of LEDs corresponds to a plurality of sub-pixels, respectively.

According to the present disclosure, a plurality of micro-sized LEDs can be easily aligned.

According to the present disclosure, a decrease in yield caused by an alignment error in the process during a transfer of a plurality of LEDs can be minimized.

According to the present disclosure, a display device with a high resolution can be easily manufactured.

According to the present disclosure, a primary transfer process and a secondary transfer process are shortened. Thus, the process time and cost for manufacturing a display device can be reduced and productivity can be improved.

The effects according to the present disclosure are not limited to the contents exemplified above, and more various effects are included in the present specification.

MODES OF THE INVENTION

Figure 1:
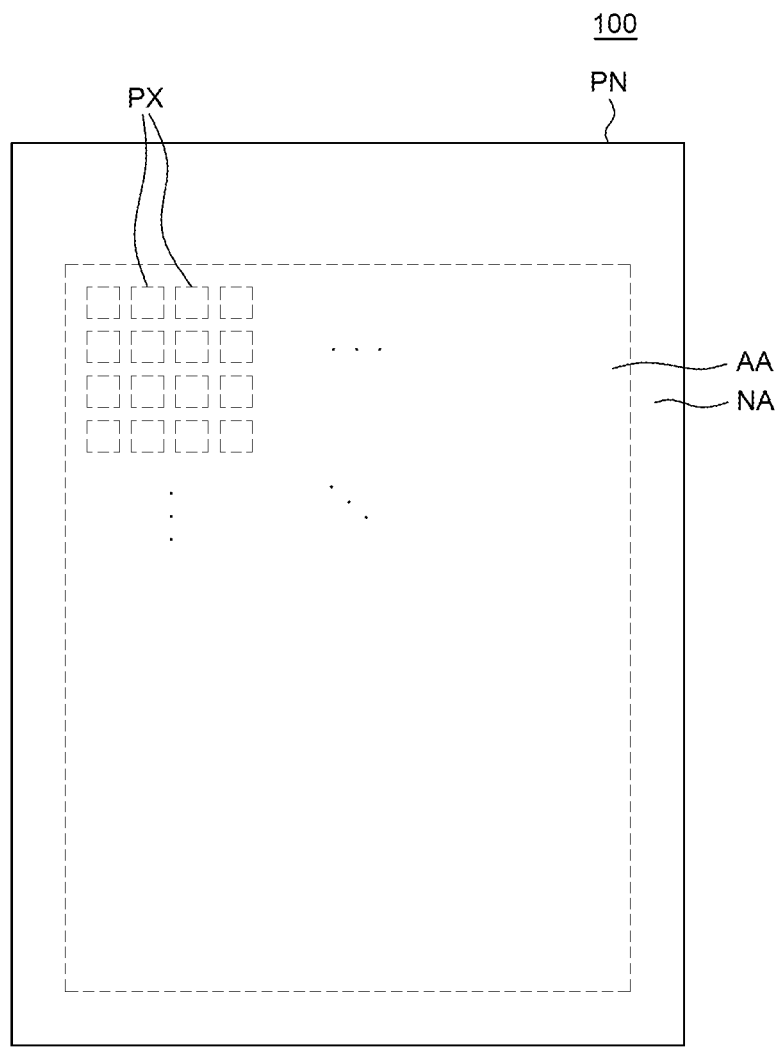
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first". "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a plan view of a display device according to an exemplary embodiment of the present disclosure. In FIG. 1, for convenience of description, only a display panel PNA and a plurality of pixels POX among various components of a display device 100 are illustrated.

The display panel PN is configured to display an image and includes a display area AA and a non-display area NA.

The display panel PN includes the display area AA and the non-display area NA.

The display area AA is an area where an image is displayed. The plurality of pixels PX for displaying an image and a circuit unit for driving the plurality of pixels PX may be disposed in the display area AA. The circuit unit may include various thin film transistors, capacitors and lines for driving the pixels PX. For example, the circuit unit may be composed of various components such as a driving thin film transistor, a switching thin film transistor, a storage capacitor, a gate line, a data line, and the like, but is not limited thereto.

The non-display area NA is an area where an image is not displayed. In the non-display area NA, various lines, driving ICs, and the like for driving the pixels PX disposed in the display area AA are disposed. For example, various driving ICs such as a gate driver IC and a data driver IC may be disposed in the non-display area NA.

Meanwhile, although FIG. 1 illustrates that the non-display area NA surrounds the display area AA, the non-display area NA may be an area extending from one side of the display area AA, but is not limited thereto.

The plurality of pixels PX is disposed in the display area AA of the display panel PN. Each of the plurality of pixels PX may be composed of a plurality of sub-pixels. Each of the plurality of sub-pixels is an individual unit that emits light and is provided with a light emitting diode and a driving circuit. For example, the plurality of pixels PX may include a red sub-pixel, a green sub-pixel, and a blue sub-pixel, but is not limited thereto. The plurality of pixels PX may further include a white sub-pixel.

Hereinafter, the plurality of pixels PX will be described in detail with reference to FIG. 2 and FIG. 3.

Figure 2:
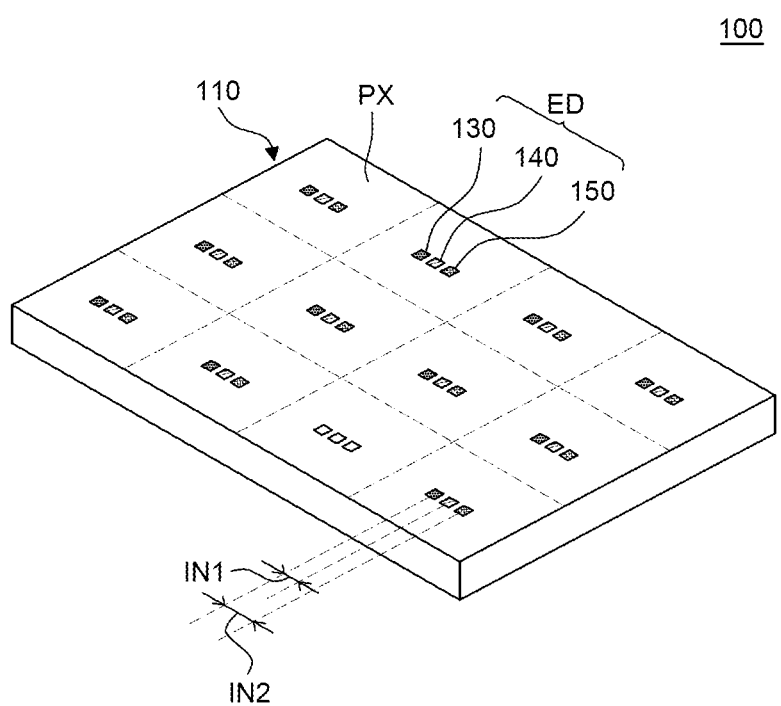
FIG. 2 is a schematic plan view of a plurality of pixels of the display device according to an exemplary embodiment of the present disclosure.

FIG. 2 is a schematic plan view of a plurality of pixels PX of the display device according to an exemplary embodiment of the present disclosure. FIG. 3 is a schematic cross-sectional view of the plurality of sub-pixels of the display device according to an exemplary embodiment of the present disclosure. Specifically. FIG. 3 is a cross-sectional view of a first sub-pixel among a plurality of sub-pixels of the display device 100 according to an exemplary embodiment of the present disclosure.

Referring to FIG. 2, each of the plurality of pixels PX includes a plurality of sub-pixels. Specifically, each of the plurality of pixels PX may include a first sub-pixel, a second sub-pixel, and a third sub-pixel. The first sub-pixel, the second sub-pixel and the third sub-pixel may emit light of different colors from each other.

In each pixel PX, the first sub-pixel, the second sub-pixel, and the third sub-pixel may be disposed in a line. Further, the first sub-pixel, the second sub-pixel and the third sub-pixel may be disposed to be equally spaced apart from each other. Based on the second sub-pixel, the first sub-pixel may be disposed on one side of the second sub-pixel and the third sub-pixel may be disposed on the other side of the second sub-pixel. Furthermore, an interval between the first sub-pixel and the second sub-pixel may be equal to an interval between the second sub-pixel and the third sub-pixel. For example, in each pixel PX, the center of the first sub-pixel and the center of the second sub-pixel may be disposed at a first interval IN1 and the center of the first sub-pixel and the center of the third sub-pixel may be disposed at a second interval IN2 which is twice the first interval IN1.

A light emitting diode (LED) ED is disposed in each of the plurality of sub-pixels. The plurality of LEDs ED serves as light emitting diodes to emit light when a voltage is applied. The plurality of LEDs ED can include LEDs ED that emit red light, green light, and blue light, and light of various colors including white can be implemented by combination thereof.

The plurality of LEDs ED includes a first LED 130, a second LED 140 and a third LED 150. The first LED 130 is disposed in the first sub-pixel, the second LED 140 is disposed in the second sub-pixel and the third LED 150 is disposed in the third sub-pixel.

Meanwhile, when the plurality of LEDs ED emits light of different colors from each other, some of the plurality of LEDs ED may be red LEDs emitting red light, some of the plurality of LEDs ED may be green LEDs emitting green light, and the others may be blue LEDs emitting blue light. Since the plurality of LEDs ED emits light of different colors from each other, a member such as a light conversion layer may be omitted. Hereinafter, it is assumed that the first LED 130 among the plurality of LEDs ED is a red LED, the second LED 140 is a green LED, and the third LED 150 is a blue LED.

However, the plurality of LEDs ED may further include a white LED that implements a white sub-pixel, and the type and number of LEDs ED disposed in a plurality of sub-pixels forming a pixel PX may vary depending on embodiments.

Figure 3:
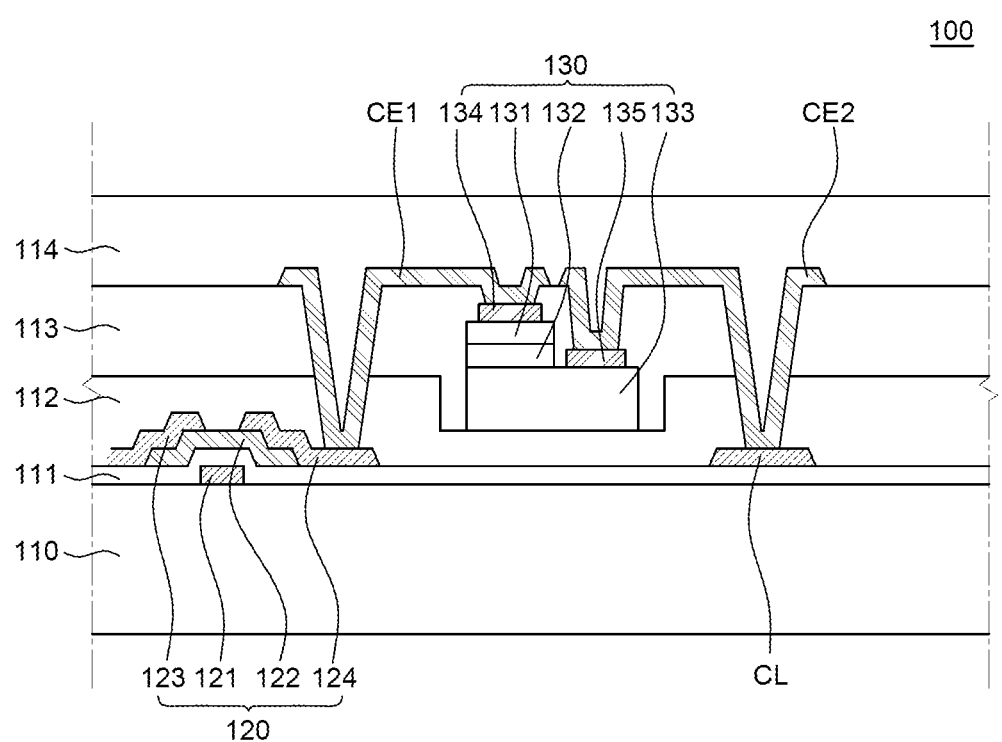
FIG. 3 is a schematic cross-sectional view of the plurality of sub-pixels of the display device according to an exemplary embodiment of the present disclosure.

Referring to FIG. 3, a substrate 110 is a support member for supporting other components of the display device 100 and may be made of an insulating material. For example, the substrate 110 may be made of glass, resin, or the like. Further, the substrate 110 may be configured to include a polymer or plastic such as polyimide PT or may be made of a material having flexibility.

A driving transistor 120 is disposed on the substrate 110 of the display panel PN. The driving transistor 120 may be used as a driving element of the display device 100. The driving transistor 120 includes a gate electrode 121, an active layer 122, a source electrode 123, and a drain electrode 124.

The gate electrode 121 is disposed on the substrate 110. The gate electrode 121 may be made of a conductive material, for example, copper (Cu), aluminum (Al), molybdenum (Mo), titanium (Ti), or an alloy thereof, but is not limited thereto.

A gate insulating layer 111 is disposed on the gate electrode 121. The gate insulating layer 111 is a layer for insulating the gate electrode 121 and the active layer 122 and may be made of an insulating material. For example, the gate insulating layer 111 may be configured by a single layer or a multilayer of silicon oxide (SiOx) or silicon nitride (SiNx), but is not limited thereto.

The active layer 122 may be disposed on the gate insulating layer 111. For example, the active layer 122 may be made of an oxide semiconductor, an amorphous silicon or a poly silicon, but is not limited thereto.

The source electrode 123 and the drain electrode 124 are disposed to be spaced apart from each other on the active layer 122. The source electrode 123 and the drain electrode 124 may be electrically connected to the active layer 122. The source electrode 123 and the drain electrode 124 may be made of a conductive material, such as copper (Cu), aluminum (Al), molybdenum (Mo), titanium (Ti) or an alloy thereof, but are not limited thereto.

Meanwhile, in the present specification, the driving transistor 120 is illustrated as having a structure in which the gate electrode 121 is disposed at the bottom, the active layer 122 is disposed on the gate electrode 121, and the source electrode 123 and the drain electrode 124 are disposed on the active layer 122, but is not limited thereto.

A common line CL is disposed on the gate insulating layer 111. The common line CL may transmit a common power, supplied from the outside to the plurality of LEDs ED of the plurality of sub-pixels. The common line CL may be made of the same material and formed by the same process as, for example, the source electrode 123 and the drain electrode 124 of the driving transistor 120. However, the material and placement of the common line CL are not limited thereto.

A first insulating layer 112 is disposed on the driving transistor 120 and the common line CL. The first insulating layer 112 is disposed on the driving transistor 120 to protect the driving transistor 120. The first insulating layer 112 may be made of an organic material such as benzocyclobutene or photo acryl.

The first LED 130 is disposed on the first insulating layer 112. The first LED 130 may be electrically connected to the source electrode 123 or the drain electrode 124 of the driving transistor 120 through a contact hole formed in the first insulating layer 112. Meanwhile, in FIG. 3, although the first LED 130 is illustrated as being disposed on the patterned first insulating layer 112, the first LED 130 may not be patterned and may be disposed on the first insulating layer 112 with a flat top surface, but is not limited thereto.

The plurality of LEDs ED may be configured to have various structures, such as a lateral type, a vertical type, and a flip chip. The lateral LED includes an n-type electrode and a p-type electrode horizontally disposed on both sides of an emission layer. The vertical LED includes an n-type electrode and a p-type electrode disposed on and below an emission layer. The flip chip LED has substantially the same structure as the lateral LED. The lateral LED includes the n-type electrode and the p-type electrode horizontally disposed on the emission layer, whereas the flip chip LED includes the n-type electrode and the p-type electrode horizontally disposed below the emission layer. Hereinafter, it is assumed that the plurality of LEDs ED has a lateral structure, but the type of the plurality of LEDs ED is not limited thereto.

Meanwhile, the LEDs may be manufactured by a process separate from a TFT array process of the display panel PN. For example, the plurality of LEDs ED may be formed on a wafer 200 made of a material such as sapphire and disposed on the display panel PN on which the driving transistor 120 and various lines are disposed through a transfer process.

The first LED 130 includes a first p-type semiconductor layer 131, a first emission layer 132, a first n-type semiconductor layer 133, a first p-type electrode 134, and a first n-type electrode 135.

The first n-type semiconductor layer 133 is disposed on the first insulating layer 112, and the first p-type semiconductor layer 131 is disposed on the first n-type semiconductor layer 133. The first p-type semiconductor layer 131 and the first n-type semiconductor layer 133 may be formed by implanting n-type or p-type impurities into gallium nitride (GaN). For example, the first p-type semiconductor layer 131 may be a layer formed by implanting p-type impurities into GaN and the first n-type semiconductor layer 133 may be a layer formed by implanting n-type impurities into GaN, but is not limited thereto. The p-type impurities may be magnesium (Mg), zinc (Zn), beryllium (Be), etc. and the n-type impurities may be silicon (Si), germanium (Ge), tin (Sn), etc., but are not limited thereto.

The first emission layer 132 is disposed between the first p-type semiconductor layer 131 and the first n-type semiconductor layer 133. The first emission layer 132 may emit light by receiving holes and electrons from the first p-type semiconductor layer 131 and the first n-type semiconductor layer 133. The first emission layer 132 may be a single layer or a multi-quantum well (MQW) structure. For example, the first emission layer 132 may be made of indium gallium nitride (InGaN) or gallium nitride (GaN), but is not limited thereto.

The first p-type electrode 134 is disposed on the first p-type semiconductor layer 131, and the first n-type electrode 135 is disposed on the first n-type semiconductor layer 133. The first p-type electrode 134 may be electrically connected to the first p-type semiconductor layer 131, and the first n-type electrode 135 may be electrically connected to the first n-type semiconductor layer 133.

A second insulating layer 113 is disposed on the first LED 130 and the first insulating layer 112. The second insulating layer 113 may be disposed on the plurality of LEDs ED to protect the plurality of LEDs ED. The second insulating layer 113 may be made of an organic material such as benzocyclobutene or photo acryl.

A first connection electrode CE1 and a second connection electrode CE2 are disposed on the second insulating layer 113. The first connection electrode CE1 may electrically connect the driving transistor 120 and the first LED 130 through a contact hole of the first insulating layer 112 and the second insulating layer 113. For example, the first connection electrode CE1 may electrically connect the drain electrode 124 of the driving transistor 120 and the first p-type electrode 134 of the first LED 130. The first connection electrode CE1 may be made of a transparent metal oxide such as indium tin oxide (ITO), indium gallium zinc oxide (IGZO), or indium gallium oxide (IGO), but is not limited thereto.

The second connection electrode CE2 may electrically connect the common line CL and the first LED 130 through the contact hole of the first insulating layer 112 and the second insulating layer 113. For example, the second connection electrode CE2 may electrically connect the common line CL and the first n-type electrode 135 of the first LED 130. The second connection electrode CE2 may be made of a transparent metal oxide such as indium tin oxide (ITO), indium gallium zinc oxide (IGZO), or indium gallium oxide (IGO), but is not limited thereto.

A buffer layer 114 is disposed on the first connection electrode CE1 and the second connection electrode CE2. The buffer layer 114 may be disposed on the entire surface of the display panel PN to protect a circuit including the plurality of LEDs ED and the driving transistor 120 from an external impact. The buffer layer 114 may be made of, for example, optical clear adhesive (OCA) or optical clear resin (OCR), but is not limited thereto.

Meanwhile, a reflective layer disposed to overlap with the plurality of LEDs ED can be further disposed. The reflective layer is disposed to overlap with the plurality of LEDs ED and thus can reflect light emitted from the plurality of LEDs ED to the outside of the display device 100 and improve the light efficiency of the display device 100.

Hereinafter, a method of manufacturing the display device 100 according to an exemplary embodiment of the present disclosure will be described with reference to FIG. 4 through FIG. 7.

Figure 4:
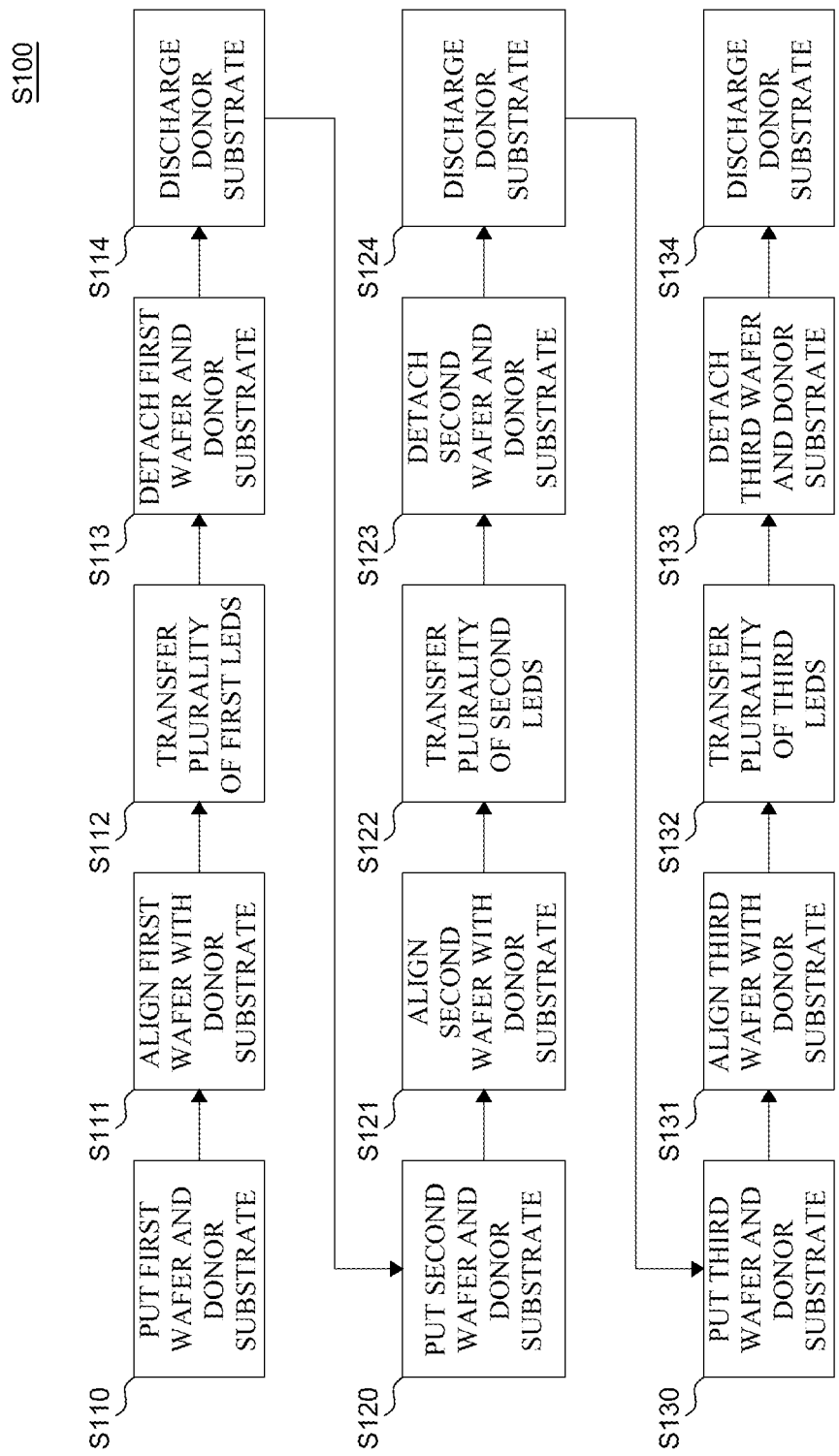
FIG. 4 is a process flowchart for explaining a method of manufacturing a display device according to an exemplary embodiment of the present disclosure.

FIG. 4 is a process flowchart for explaining a method of manufacturing a display device according to an exemplary embodiment of the present disclosure. FIG. 5A through FIG. 5L are schematic process diagrams for explaining the method of manufacturing a display device according to an exemplary embodiment of the present disclosure. Specifically, FIG. 4 is a process flowchart for explaining a primary transfer process by which the plurality of LEDs ED on the wafer 200 is transferred to a donor substrate 300, and FIG. 5A through FIG. 5L are schematic process diagrams for explaining the primary transfer process. The cross-sectional views of FIG. 5C, FIG. 5F, FIG. 5G, FIG. 5I, FIG. 5J and FIG. 5K are taken along line A-A' of FIG. 5B.

The plurality of LEDs ED on the wafer 200 may be transferred to the donor substrate 300 by performing the primary transfer process, and the plurality of LEDs ED on the donor substrate 300 may be transferred to the display panel PN by performing a secondary transfer process. Accordingly, the manufacturing process of the display device 100 may be completed by transferring the plurality of LEDs ED from the wafer 200 to the donor substrate 300 and from the donor substrate 300 to the display panel PN. Here, in the method of manufacturing the display device 100 according to an exemplary embodiment of the present disclosure, it is assumed that a reference member for aligning the donor substrate 300 with the wafer 200 and the donor substrate 300 with the display panel PN is a second alignment key AK2 transferred to the donor substrate 300 from a first wafer 210 together with the first LED 130.

Hereinafter, the primary transfer process S100 will be described with reference to FIG. 4 and FIG. 5A through FIG. 5L.

Figure 5A:
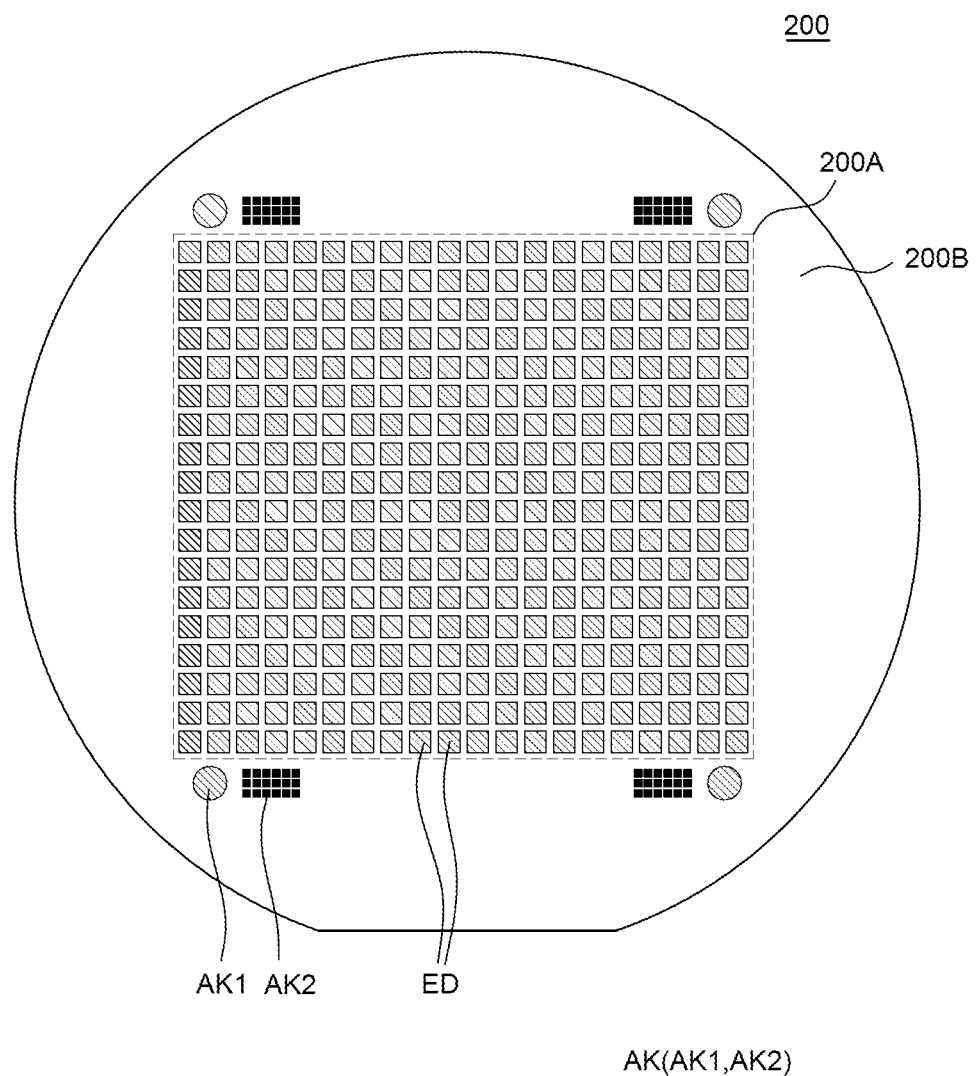
FIG. 5A through FIG. 5L are schematic process diagrams for explaining the method of manufacturing a display device according to an exemplary embodiment of the present disclosure.

Referring to FIG. 4 and FIG. 5A together, the wafer 200 is a substrate on which the plurality of LEDs ED is formed. A material such as gallium nitride (GaN) or indium gallium nitride (InGaN) forming the plurality of LEDs ED is formed on the wafer 200 to grow a crystal layer. The crystal layer is cut into individual chips and electrodes are formed to form the plurality of LEDs ED. The wafer 200 may be made of sapphire, silicon carbide (SiC), gallium nitride (GaN), zinc oxide (ZnO), or the like, but is not limited thereto.

In this case, the plurality of LEDs ED emitting light of the same color or the plurality of LEDs ED emitting light of different colors may be formed on one wafer 200. Hereinafter, it is assumed that the plurality of LEDs ED emitting light of the same color is formed on one wafer 200.

The wafer 200 includes an active area 200A and an outer area 200B. The active area 200A is an area where the plurality of LEDs ED is formed, and the outer area 200B disposed outside the active area 200A is an area where a plurality of alignment keys AK is disposed.

The plurality of alignment keys AK includes a first alignment key AK1 and a second alignment key AK2. The first alignment key AK1 and the second alignment key AK2 may be disposed adjacent to an edge of the wafer 200 in the outer area 200B. However, the first alignment key AK1 and the second alignment key AK2 may be disposed at positions other than the edge of the wafer 200 depending on the design, and the number of first alignment keys AK1 and second alignment keys AK2 may also be variously designed.

The first alignment key AK1 is a component used to align the wafer 200 and the donor substrate 300. The first alignment key AK1 is a mark for adjusting alignment and parallelism between the wafer 200 and the donor substrate 300 when the plurality of LEDs ED of the wafer 200 is transferred to the donor substrate 300. For example, alignment and parallelism between the wafer 200 and the donor substrate 300 may be adjusted by aligning the first alignment key AK1 of the wafer 200 and an alignment protrusion 332 of the donor substrate 300.

The second alignment key AK2 is a component used to align the donor substrate 300 and the display panel PN. The second alignment key AK2 may be transferred to the donor substrate 300 together with the plurality of LEDs ED when the plurality of LEDs ED of the wafer 200 is transferred to the donor substrate 300. Then, alignment and parallelism between the donor substrate 300 and the display panel PN may be adjusted by using the second alignment key AK2 on the donor substrate 300.

The first alignment key AK1 and the second alignment key AK2 may be formed together when the plurality of LEDs ED is formed, or may be formed by a separate process from the plurality of LEDs ED. If the first alignment key AK1 and the second alignment key AK2 are formed together with the plurality of LEDs ED, the first alignment key AK1 and the second alignment key AK2 may be made of the same materials as at least some of the materials forming the plurality of LEDs ED. However, the materials and forming processes of the first alignment key AK1 and the second alignment key AK2 may be variously configured depending on the design, but are not limited thereto.

The shapes and sizes of the first alignment key AK1 and the second alignment key AK2 may be variously configured. In order to identify the first alignment key AK1 and the second alignment key AK2 disposed in the outer area 200B, the first alignment key AK1 may have a different shape or size from the second alignment key AK2. For example, the first alignment key AK1 may have a larger size than the second alignment key AK2, but is not limited thereto.

Figure 5B:
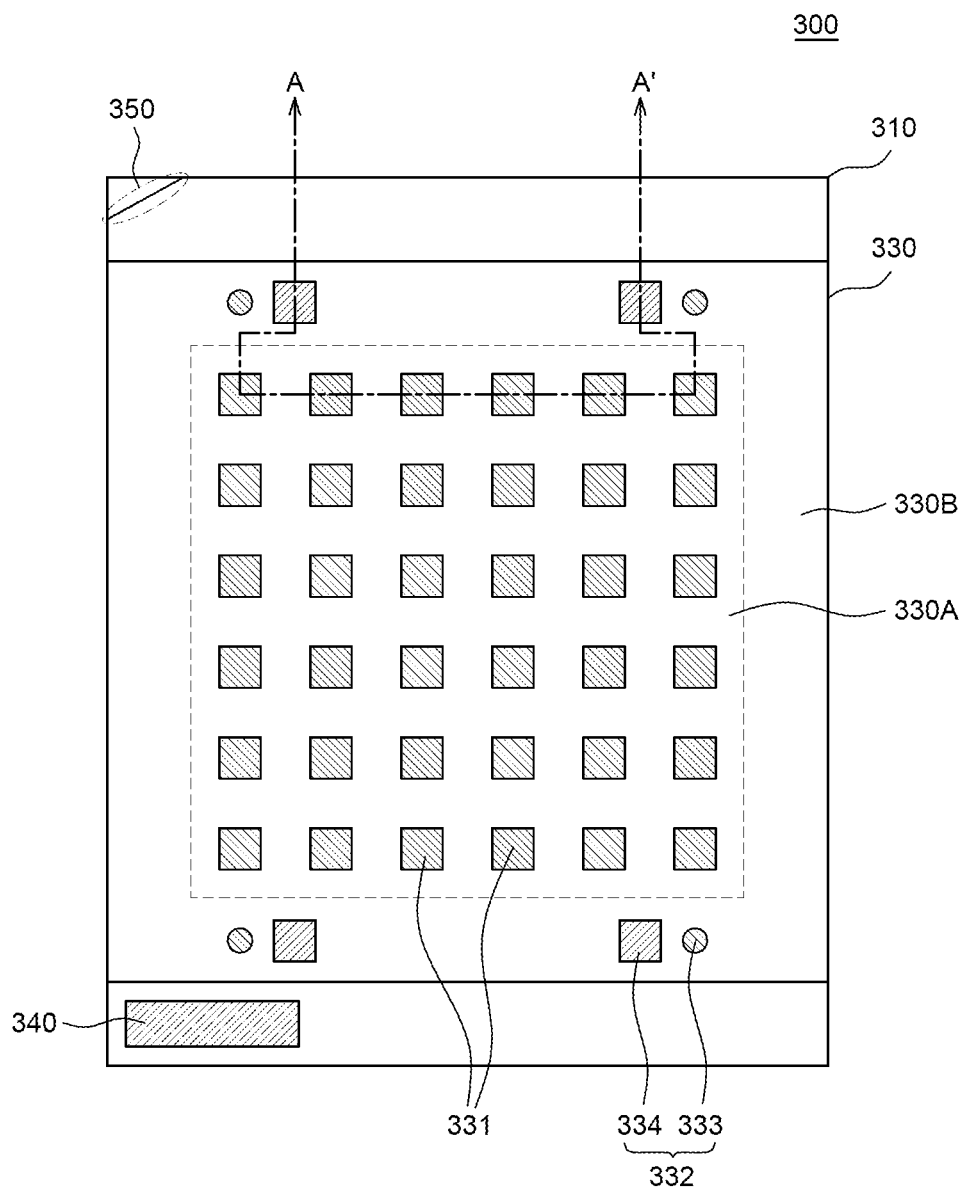

Referring to FIG. 5B, the donor substrate 300 includes a base layer 310, an adhesive layer 320, a resin layer 330, a plurality of protrusions 331, and a plurality of alignment protrusions 332.

The base layer 310 is configured to support various components included in the donor substrate 300 and may be made of a more rigid material than at least the resin layer 330 in order to minimize bending of the resin layer 330. The base layer 310 may be disposed under the resin layer 330 to support the resin layer 330, the plurality of protrusions 331, and the plurality of alignment protrusions 332. For example, the base layer 310 may be configured to include a polymer or plastic and may be made of poly carbonate (PC) or polyethylene terephthalate (PET), but is not limited thereto.

Meanwhile, an identification pattern 340 and an orientation pattern 350 may be disposed on a portion of the base layer 310 protruding toward the outside of the resin layer 330.

An identification pattern 340 is a pattern formed on the base layer 310 to identify the donor substrate 300. A plurality of donor substrates 300 may be managed using unique identification patterns 340 given to the respective donor substrates 300. The identification pattern 340 may be disposed on an upper surface or a rear surface of the base layer 310 and may be formed by a printing method or a laser engraving method. For example, the identification pattern 340 may be an ID composed of numbers or characters or a barcode, but is not limited thereto. Meanwhile, in FIG. 5B, although a single identification pattern 340 is illustrated as being formed on the lower left side of the donor substrate 300, the number and placement of identification patterns are not limited thereto.

An orientation pattern 350 is a pattern formed on the base layer 310 to distinguish the orientation of the donor substrate 300. For example, when the donor substrate 300 is put into process equipment, if the donor substrate 300 is put in the opposite direction, the LEDs ED may be transferred to a different position from the designed position, or a defect may occur. Accordingly, the orientation pattern 350 may be disposed on any one portion of the base layer 310 in order to distinguish the orientation of the donor substrate 300. The orientation pattern 350 may be formed by a printing method or a laser engraving method or may be formed by chamfering an edge of the base layer 310, but is not limited thereto.

The resin layer 330 is disposed on the base layer 310. During the transfer process, the resin layer 330 may support the plurality of protrusions 331 to which the plurality of LEDs ED is attached. The resin layer 330 may be made of a polymer resin having viscoelasticity. For example, the resin layer 330 may be made of poly di methyl siloxane (PDMS), poly urethane acrylate (PUA), polyethylene glycol (PEG), poly methyl meth acrylate (PMMA), poly styrene (PS), epoxy resin, urethane resin, acrylic resin, etc., but is not limited thereto.

The resin layer 330 includes a transfer area 330A and a non-transfer area 330B.

The transfer area 330A is an area where the plurality of protrusions 331 is disposed. The transfer area 330A is an area where the plurality of protrusions 331 to which the plurality of LEDs ED is attached is disposed. The transfer area 330A may be disposed to overlap with at least a portion of the wafer 200 or the display panel PN during a transfer process.

The non-transfer area 330B is an area where the plurality of alignment protrusions 332 is disposed. The plurality of LEDs ED of the wafer 200 may not be transferred to the non-transfer area 330B, but the second alignment key AK2 of the wafer 200 may be transferred to the non-transfer area 330B.

The plurality of protrusions 331 may be protrusions 331 on which the plurality of LEDs ED is disposed and may be extended from one surface of the resin layer 330. The plurality of protrusions 331 may be formed integrally with the resin layer 330, and may be made of a polymer material having viscoelasticity like the resin layer 330. For example, the plurality of protrusions 331 may be made of poly di methyl siloxane (PDMS), poly urethane acrylate (PUA), polyethylene glycol (PEG), poly methyl meth acrylate (PMMA), poly styrene (PS), epoxy resin, urethane resin, acrylic resin, etc., but is not limited thereto.

The plurality of LEDs ED may be temporarily attached to upper surfaces of the plurality of protrusions 331. The plurality of LEDs ED formed on the wafer 200 may be transferred to the upper surfaces of the plurality of protrusions 331 and may temporarily continue to be attached to the upper surfaces of the plurality of protrusions 331 before being transferred to the display panel PN.

In this case, the plurality of protrusions 331 may be disposed at the same interval as the interval between the plurality of sub-pixels. For example, when the plurality of LEDs ED is transferred to the display panel PN, the plurality of LEDs ED is transferred corresponding to the plurality of sub-pixels, respectively. If the plurality of LEDs ED transferred to the donor substrate 300 is transferred at a time, the plurality of LEDs ED on the donor substrate 300 needs to be disposed corresponding to the plurality of sub-pixels, respectively. In this case, the plurality of LEDs ED transferred to the display panel PN at once may be transferred corresponding to the plurality of sub-pixels, respectively. However, the placement and interval of the plurality of protrusions 331 may vary depending on the design, but are not limited thereto.

The plurality of protrusions 331 may have a larger size than the plurality of LEDs ED. The upper surfaces of the plurality of protrusions 331 are formed larger in size than the plurality of LEDs ED. Thus, even if an alignment error between the donor substrate 300 and the wafer 200 occurs, the plurality of LEDs ED may be mounted on the plurality of protrusions 331. Accordingly, in consideration of the alignment error between the wafer 200 and the donor substrate 300, the upper surfaces of the plurality of protrusions 331 may be formed larger in size than the plurality of LEDs ED.

The plurality of alignment protrusions 332 is disposed in the non-transfer area 330B. The plurality of alignment protrusions 332 includes a plurality of first alignment protrusions 333 and a plurality of second alignment protrusions 334.

The plurality of first alignment protrusions 333 is used to align the wafer 200 and the donor substrate 300. The plurality of first alignment protrusions 333 may be disposed corresponding to the first alignment key AK1 of the wafer 200. For example, alignment and parallelism between the wafer 200 and the donor substrate 300 may be adjusted by aligning the first alignment key AK1 of the first wafer 210 and the first alignment protrusion 333 of the donor substrate 300. In this case, the first alignment protrusion 333 may have a different shape or size from the first alignment key AK1 to facilitate identification. For example, any one of the first alignment protrusion 333 and the first alignment key AK1 may have a donut shape with a hole in the middle, and the other one may have a circular shape overlapping with the hole. FIG. 5A and FIG. 5B illustrate that the first alignment key AK1 of the wafer 200 and the first alignment protrusion 333 of the donor substrate 300 are circular, but the shapes of the first alignment key AK1 and the first alignment protrusion 333 are not limited thereto.

The second alignment protrusion 334 may be disposed corresponding to the second alignment key AK2 of the wafer 200. For example, after aligning the first alignment key AK1 of the wafer 200 and the first alignment protrusion 333 of the donor substrate 300 to align the wafer 200 and the donor substrate 300, the plurality of LEDs ED of the wafer 200 may be transferred to the plurality of protrusions 331 of the donor substrate 300 and the second alignment key AK2 of the wafer 200 may be transferred to the second alignment protrusion 334 of the donor substrate 300. In this case, the second alignment key AK2 transferred to the donor substrate 300 may be used later to align the display panel PN with the donor substrate 300.

Meanwhile, a plurality of protrusions other than the plurality of alignment protrusions 332 can be further disposed in the non-transfer area 330B. Specifically, in order to minimize deformation of the resin layer 330 and the plurality of protrusions 331 in the transfer area 330A caused by an impact applied to the donor substrate 300 during a transfer process, a plurality of protrusions can be further disposed in the non-transfer area 330B. For example, when the plurality of LEDs ED is transferred onto the donor substrate 300 after the wafer 200 is bonded to the donor substrate 300, the plurality of LEDs ED can apply an impact to the donor substrate 300 while moving onto the donor substrate 300. When the impact is applied to the donor substrate 300, the positions or shapes of the resin layer 330 and the plurality of protrusions 331 in the transfer area 330A can be changed. In this case, the plurality of protrusions in the non-transfer area 330B disposed to surround the transfer area 330A can continue to be bonded to the wafer and minimize deformation of the resin layer 330 and the plurality of protrusions 331 in the transfer area 330A.

Meanwhile, the plurality of protrusions 331 may not be disposed in the donor substrate 300, and the plurality of LEDs ED may be directly transferred onto the resin layer 330. That is, the donor substrate 300 may not include the separate protrusion 331. The structure of the donor substrate 300 may vary depending on the shape, placement, and transfer method of the plurality of LEDs ED, but is not limited thereto. Hereinafter, for convenience of description, it is assumed that the donor substrate 300 includes the plurality of protrusions 331 and the plurality of LEDs ED is transferred to the plurality of protrusions 331, respectively.

The adhesive layer 320 is disposed between the resin layer 330 and the base layer 310. The adhesive layer 320 bonds the resin layer 330 to the display panel PN. The adhesive layer 320 may be made of a material having an adhesive property, for example, optical clear adhesive (OCA), pressure sensitive adhesive (PSA), or the like, but is not limited thereto.

However, the adhesive layer 320 may be omitted depending on the design. For example, the resin layer 330 may be formed by directly coating a material forming the resin layer 330 on the base layer 310 and then curing the material. In this case, since the resin layer 330 may be attached to the base layer 310 even if the adhesive layer 320 is not disposed, the adhesive layer 320 may be omitted depending on the design, but is not limited thereto.

Figure 5C:
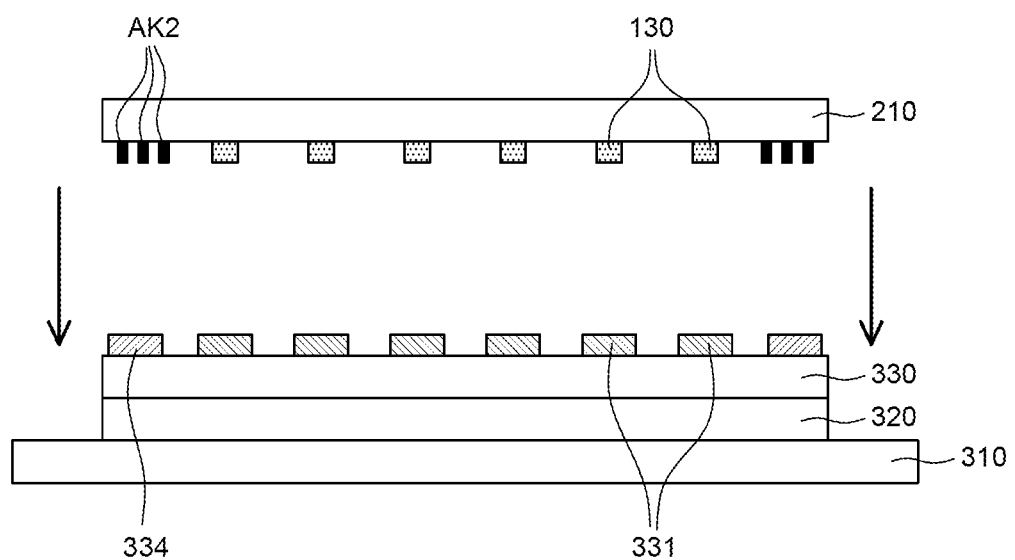
Figure 5D:
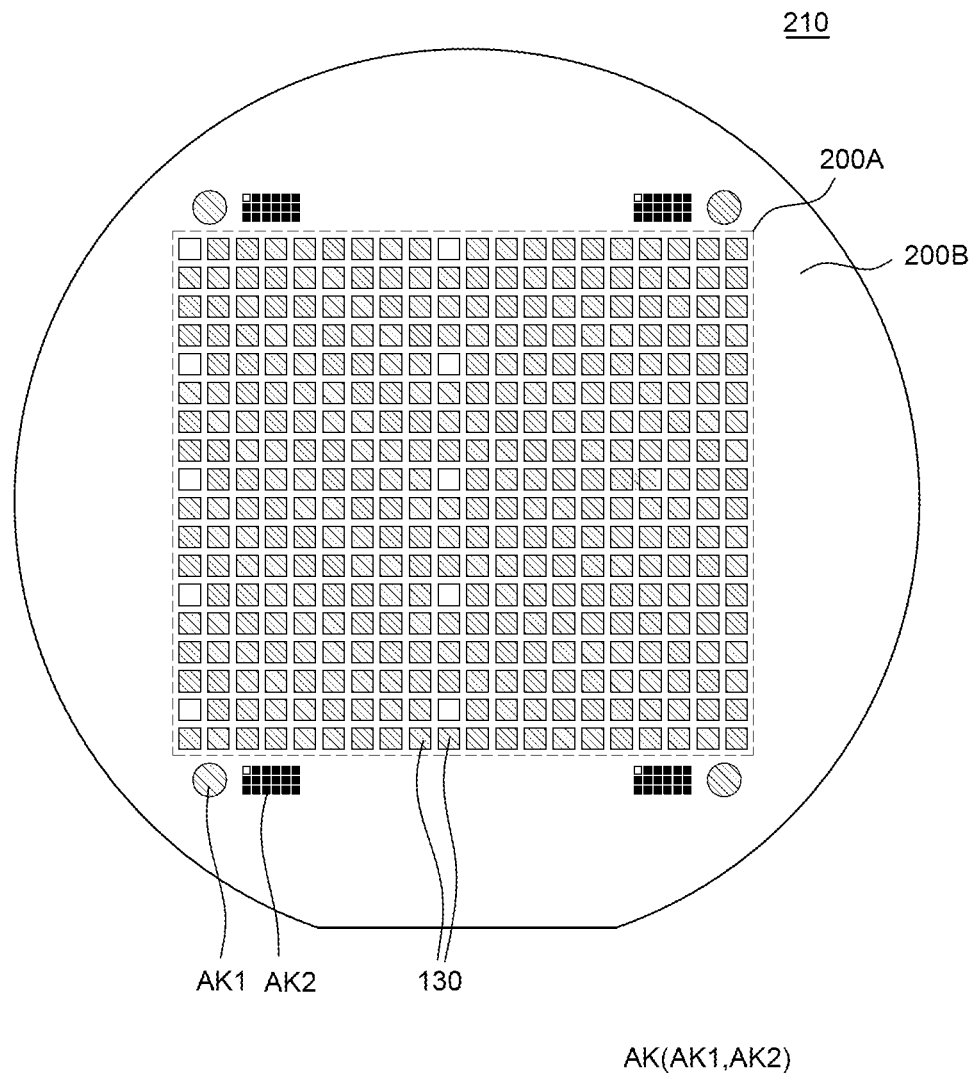
Figure 5E:
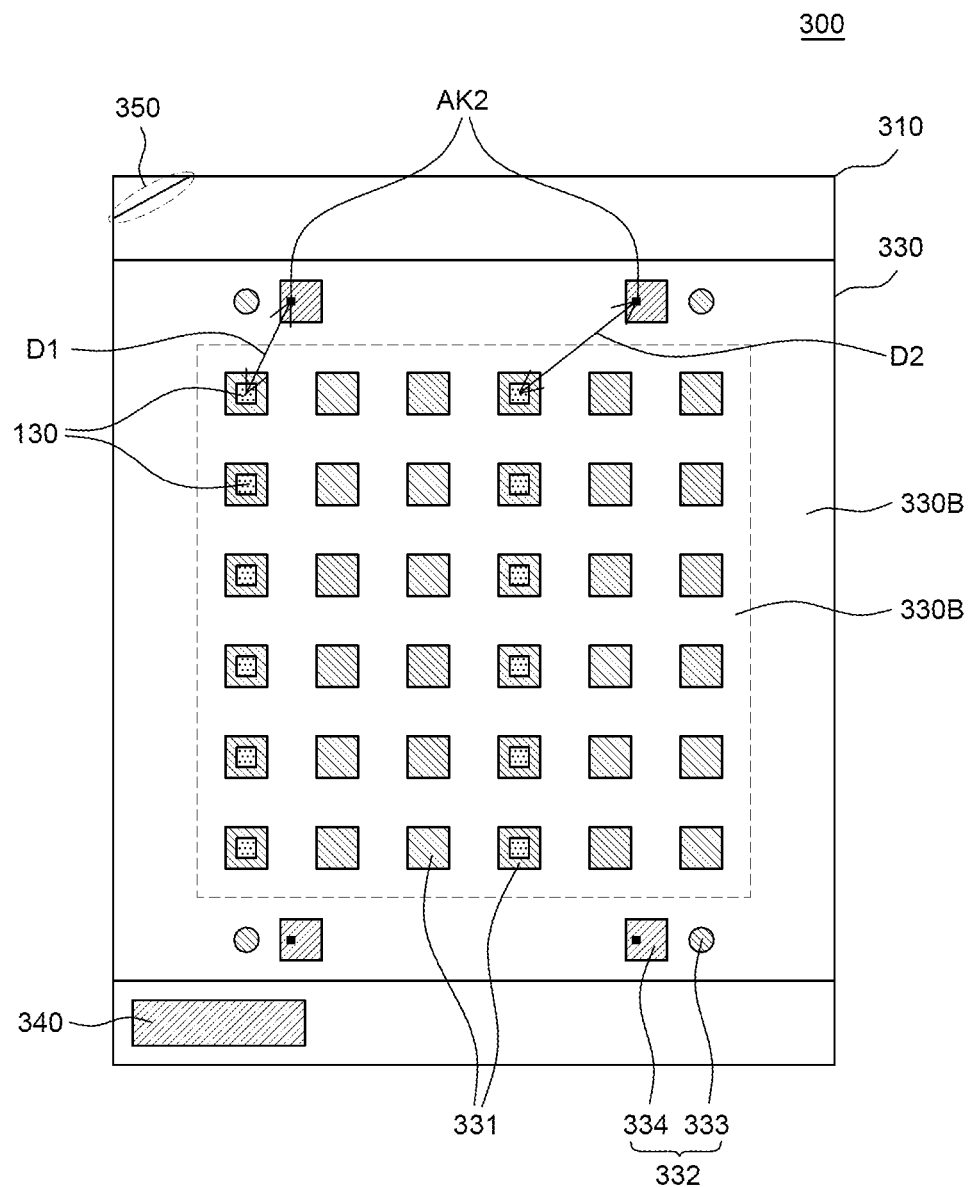

Referring FIG. 5C through FIG. 5E together, the first wafer 210 on which a plurality of first LEDs 130 is formed and the donor substrate 300 are put into the process equipment (S110). Then, the first wafer 210 and the donor substrate 300 in the process equipment are aligned (S111). In a state where the first wafer 210 and the donor substrate 300 are disposed such that the plurality of first LEDs 130 on the first wafer 210 and the plurality of protrusions 331 of the donor substrate 300 face each other, the first wafer 210 and the donor substrate 300 may be aligned. Specifically, the first wafer 210 and the donor substrate 300 may be aligned by aligning the center of the first alignment key AK1 of the first wafer 210 with the center of the first alignment protrusion 333 of the donor substrate 300.

After the alignment between the first wafer 210 and the donor substrate 300 is completed, the plurality of first LEDs 130 of the first wafer 210 is transferred to the donor substrate 300 (S112). In a state where the first wafer 210 and the donor substrate 300 are disposed to face each other, a laser may be selectively irradiated only to the first LED 130 to be transferred to the donor substrate 300 among the plurality of first LEDs 130. The first LED 130 irradiated with the laser may be detached from the first wafer 210 and then attached to the plurality of protrusions 331 of the donor substrate 300.

In this case, at least some of the plurality of second alignment keys AK2 of the wafer 200 may also be transferred to the donor substrate 300. In a state where the first wafer 210 and the donor substrate 300 are disposed to face each other, a laser may be selectively irradiated only to some second alignment keys AK2 to be transferred to the donor substrate 300 among the plurality of second alignment keys AK2. The second alignment keys AK2 irradiated with the laser may be detached from the first wafer 210 and then attached to the second alignment protrusions 334 of the donor substrate 300.

Referring to FIG. 5D, after the transfer of the plurality of first LEDs 130 and the second alignment keys AK2 is completed, some of the first LEDs 130 and some of the second alignment keys AK2, which are not transferred to the donor substrate 300, may remain on the first wafer 210. Further, the first LEDs 130 and second alignment keys AK2 remaining on the first wafer 210 may be transferred onto another donor substrate 300 and then transferred to the display panel PN.

Referring to FIG. 5E, the plurality of first LEDs 130 may be transferred to the protrusions 331 at positions corresponding to the first sub-pixels among the plurality of protrusions 331 of the donor substrate 300. The plurality of first LEDs 130 may be LEDs ED disposed in the first sub-pixels. Further, the plurality of protrusions 331 of the donor substrate 300 is disposed corresponding to the sub-pixels. Accordingly, the plurality of first LEDs 130 is transferred only onto some protrusions 331 to be aligned corresponding to the first sub-pixels in a secondary transfer process to be described later among the plurality of protrusions 331 of the donor substrate 300. Thus, the plurality of first LEDs 130 may be transferred to the first sub-pixel of the display panel PN at once.

Meanwhile, an interval between a specific first LED 130 and the second alignment key AK2 among the plurality of first LEDs 130 transferred to the donor substrate 300 is constant. Specifically, an interval between a specific second alignment key AK2 and the first LED 130 disposed at the shortest distance on the first wafer 210 and an interval between the specific second alignment key AK2 and the first LEDs 130 disposed at the shortest distance on the donor substrate 300 may be constant. For example, the second alignment key AK2 disposed at an upper left end among the four second alignment keys AK2 transferred to the donor substrate 300 and the first LED 130 disposed at the upper left end to be closest thereto may have an interval of D1 on the first wafer 210 and may also have the interval of D1 on the donor substrate 300. Further, the second alignment key AK2 disposed at an upper right end among the four second alignment keys AK2 transferred to the donor substrate 300 and the first LED 130 disposed at the upper right end to be closest thereto may have an interval of D2 on the first wafer 210 and may also have the interval of D2 on the donor substrate 300. That is, when the plurality of first LEDs 130 and the plurality of second alignment keys AK2 are transferred, the plurality of second alignment keys AK2 may be transferred at a predetermined interval from the respective first LEDs 130 disposed at the shortest distance.

Therefore, if the plurality of second alignment keys AK2 is disposed to deviate from their original positions on the plurality of second alignment protrusions 334, the plurality of first LEDs 130 at a predetermined interval from the plurality of second alignment keys AK2, respectively, may also be disposed to deviate from their original positions on the plurality of protrusions 331. Accordingly, the positions of the plurality of first LEDs 130 may be easily identified through the second alignment keys AK2.

After the plurality of first LEDs 130 of the first wafer 210 is transferred to the donor substrate 300, the first wafer 210 and the donor substrate 300 are detached (S113), and the donor substrate 300 to which the first LEDs 130 are transferred is discharged from the process equipment (S114).

Then, the donor substrate 300 on which the first LEDs 130 are disposed and a second wafer 220 on which a plurality of second LEDs 140 is formed are put into the process equipment (S120). Thereafter, the second wafer 220 and the donor substrate 300 are aligned (S121) and the plurality of second LEDs 140 is transferred to the donor substrate 300 (S122).

Figure 5F:
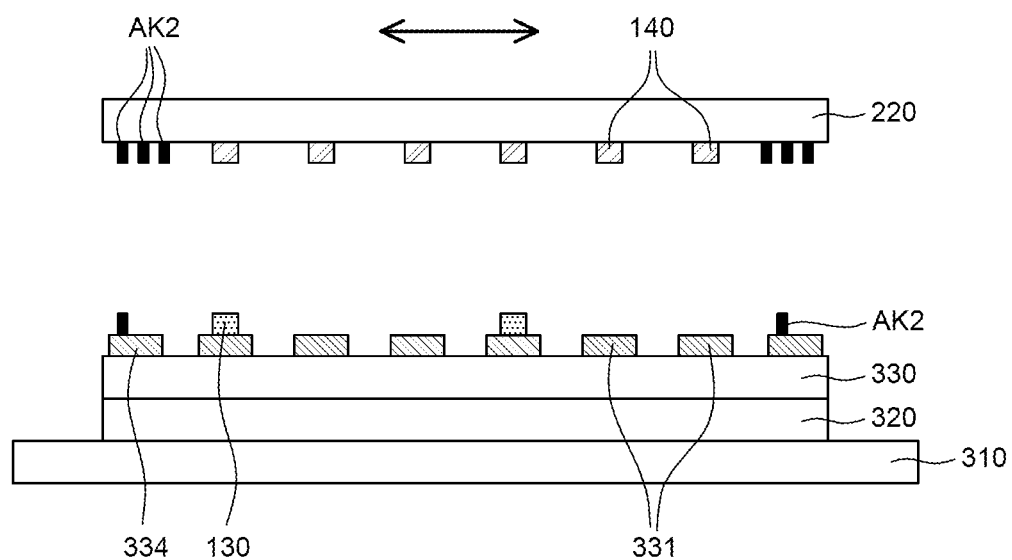

Referring to FIG. 5F, in a state where the second wafer 220 and the donor substrate 300 are disposed such that the plurality of second LEDs 140 on the second wafer 220 and the plurality of protrusions 331 of the donor substrate 300 face each other, the second wafer 220 and the donor substrate 300 may be aligned.

In this case, the first wafer 210 and the donor substrate 300 are aligned based on the first alignment key AK1 and the first alignment protrusion 333. However, the second wafer 220 and the donor substrate 300 may be aligned based on at least some of the plurality of second alignment keys AK2 transferred to the donor substrate 300 from the first wafer 210.

Specifically, when the donor substrate 300 on which the plurality of first LEDs 130 and the plurality of second alignment keys AK2 are disposed is aligned with the second wafer 220, they may be aligned based on one or more second alignment keys AK2 among the plurality of second alignment keys AK2 disposed on the donor substrate 300 and any one component among the components of the second wafer 220. For example, the second wafer 220 and the donor substrate 300 may be aligned based on the plurality of second alignment keys AK2 transferred to the donor substrate 300 from the first wafer 210 and the first alignment keys AK1 or the second alignment keys AK2 of the second wafer 220. Alternatively, the second wafer 220 and the donor substrate 300 may be aligned based on the plurality of second alignment keys AK2 transferred to the donor substrate 300 from the first wafer 210 and some of the plurality of second LEDs 140 of the second wafer 220.

As described above, an interval between the second alignment key AK2 and the first LED 130 disposed on the donor substrate 300 is constant, and, thus, the position of the first LED 130 may be identified through the second alignment key AK2. Accordingly, when the second wafer 220 and the donor substrate 300 are aligned based on the second alignment key AK2 disposed on the donor substrate 300, a relative position between the plurality of first LEDs 130 on the donor substrate 300 and the plurality of second LEDs 140 of the second wafer 220 may be aligned. For example, the plurality of first LEDs 130 and the plurality of second LEDs 140 on the donor substrate 300 may be transferred to the display panel PN at a time at the first interval IN1 which is an interval between the plurality of sub-pixels on the donor substrate 300. When the plurality of second LEDs 140 is transferred to the donor substrate 300, the second wafer 220 and the donor substrate 300 may be aligned using, as a reference member, the second alignment keys AK2 disposed at a predetermined interval, i.e., the first interval IN1, from the plurality of first LEDs 130 of the donor substrate 300.

In this case, only the plurality of second LEDs 140 may be transferred to the donor substrate 300 from the second wafer 220, but the plurality of second alignment keys AK2 may not be transferred. Since different masks or lasers are used for the plurality of second LEDs 140 and the plurality of second alignment keys AK2 during a transfer process, they cannot be transferred simultaneously to the donor substrate 300, but may be transferred sequentially. If the plurality of first LEDs 130, the plurality of second LEDs 140, and a plurality of third LEDs 150 are transferred to respective donor substrates 300, the plurality of second alignment keys AK2 may be transferred to each of the donor substrates 300 to align the display panel PN and the donor substrate 300. However, in the method of manufacturing a display device according to an exemplary embodiment of the present disclosure, the plurality of first LEDs 130, the plurality of second LEDs 140, and the plurality of third LEDs 150 are transferred to the same donor substrate 300 and the second alignment keys AK2 transferred together with the plurality of first LEDs 130 are already disposed on the donor substrate 300. Thus, the second alignment keys AK2 of the second wafer 220 or a third wafer 230 may not be transferred to the donor substrate 300. Therefore, the process time for transferring the second alignment keys AK2 may be reduced.

Meanwhile, by using the plurality of second alignment keys AK2 transferred to the donor substrate 300 as a reference member for aligning the second wafer 220 and the donor substrate 300, the alignment accuracy of the plurality of LEDs ED may be improved. This will be described later in detail with reference to FIG. 8 through FIG. 11.

Meanwhile, the first alignment key AK1 may be omitted in some wafers 200 depending on the order of use of the wafers 200. For example, after the first wafer 210 on which the plurality of first LEDs 130 is formed and the donor substrate 300 are aligned based on the first alignment key AK1, the plurality of first LEDs 130 and the second alignment key AK2 of the first wafer 210 may be transferred to the donor substrate 300 and the second wafer 220 on which the plurality of second LEDs 140 is formed and the donor substrate 300 may be aligned based on the second alignment key AK2 transferred to the donor substrate 300. In this case, the first alignment key AK1 may be omitted in the second wafer 220 and the third wafer 230. However, the plurality of first alignment keys AK1 may be disposed in each of the plurality of wafers 200 regardless of the process order, but is not limited thereto.

Figure 5G:
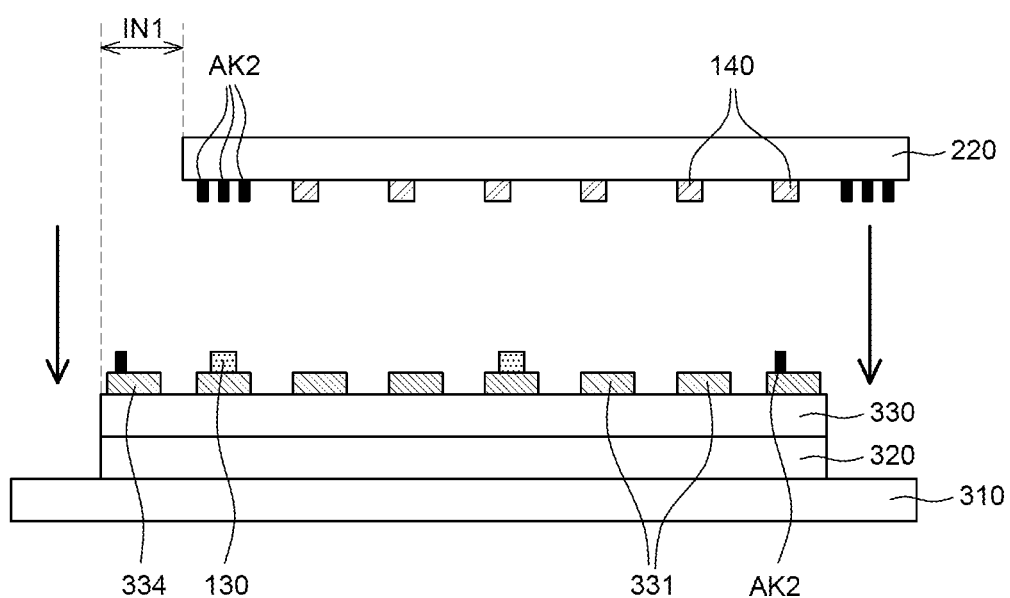

Referring to FIG. 5G, after the alignment between the second wafer 220 and the donor substrate 300 is completed, the second wafer 220 may be shifted by the first interval IN1. After the second wafer 220 is shifted by the first interval IN1, i.e., the interval between the plurality of sub-pixels, the plurality of second LEDs 140 is transferred to the donor substrate 300.

If the second wafer 220 is not shifted and a laser is irradiated to the same position of the second wafer 220 as that of the first wafer 210, the plurality of second LEDs 140 may be transferred to the protrusions 331 on which the plurality of first LEDs 130 is disposed, and the plurality of first LEDs 130 and the plurality of second LEDs 140 may interfere with each other. Accordingly, after the second wafer 220 is shifted by the first interval IN1 which is the interval between the sub-pixels, a laser may be irradiated to the second wafer 220 to transfer the plurality of second LEDs 140 to the donor substrate 300. Further, the second LED 140 irradiated with the laser may be detached from the second wafer 220 and attached to the plurality of protrusions 331 of the donor substrate 300.

Figure 5H:
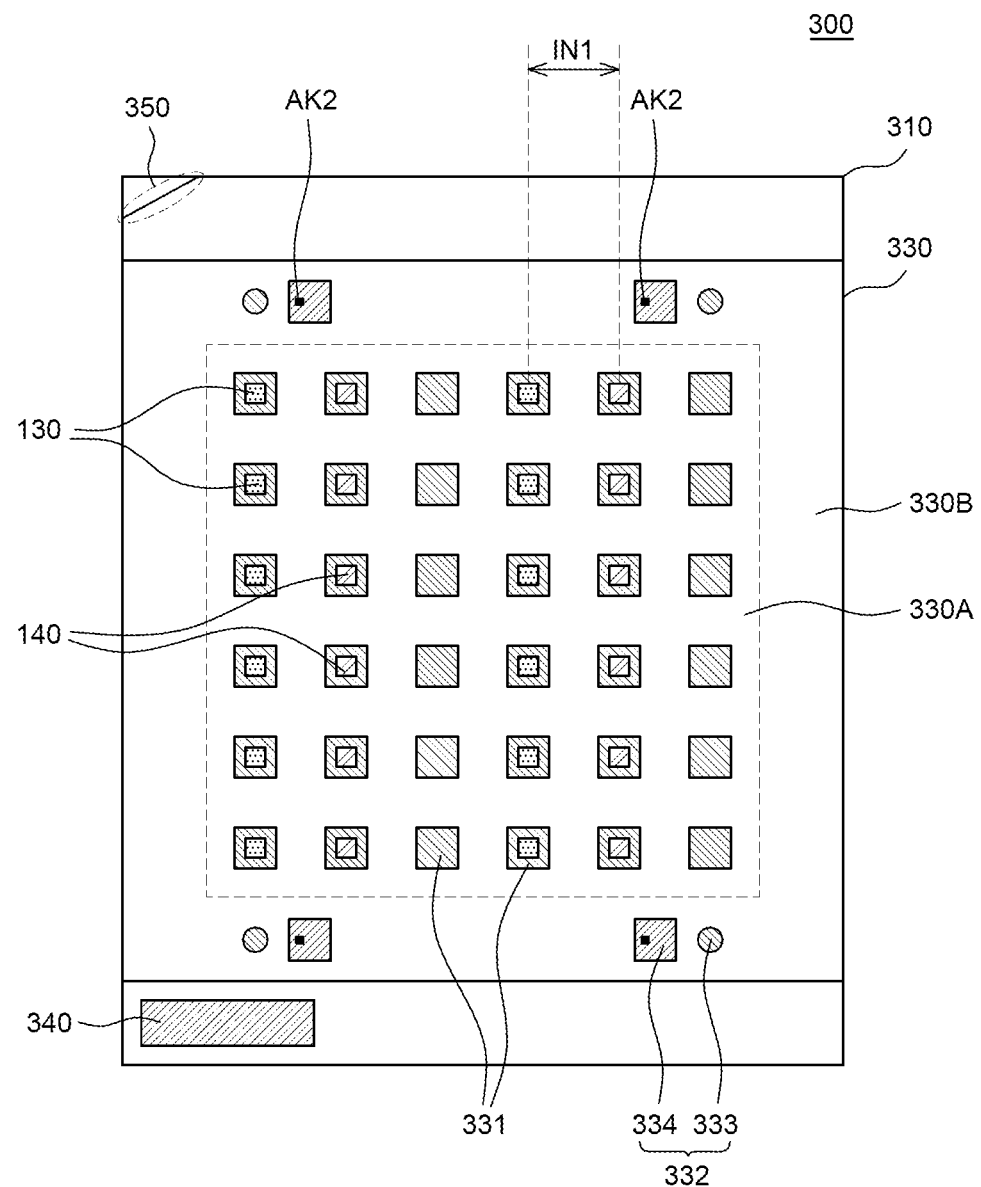

Referring to FIG. 5H, the plurality of second LEDs 140 may be transferred to the protrusions 331 at positions corresponding to the second sub-pixels among the plurality of protrusions 331 of the donor substrate 300. The plurality of second LEDs 140 may be LEDs ED disposed in the second sub-pixels. Thus, the plurality of second LEDs 140 may be transferred only to some protrusions 331 to be aligned corresponding to the second sub-pixels among the plurality of protrusions 331 disposed corresponding to the plurality of sub-pixels.

After the plurality of second LEDs 140 of the second wafer 220 is transferred to the donor substrate 300, the second wafer 220 and the donor substrate 300 are detached (S123) and the donor substrate 300 to which the second LEDs 140 are transferred is discharged from the process equipment (S124).

Then, the donor substrate 300 on which the first LEDs 130 and the second LEDs 140 are disposed and the third wafer 230 on which a plurality of third LEDs 150 is formed are put into the process equipment (S130). Thereafter, the third wafer 230 and the donor substrate 300 are aligned (S131).

Figure 5I:
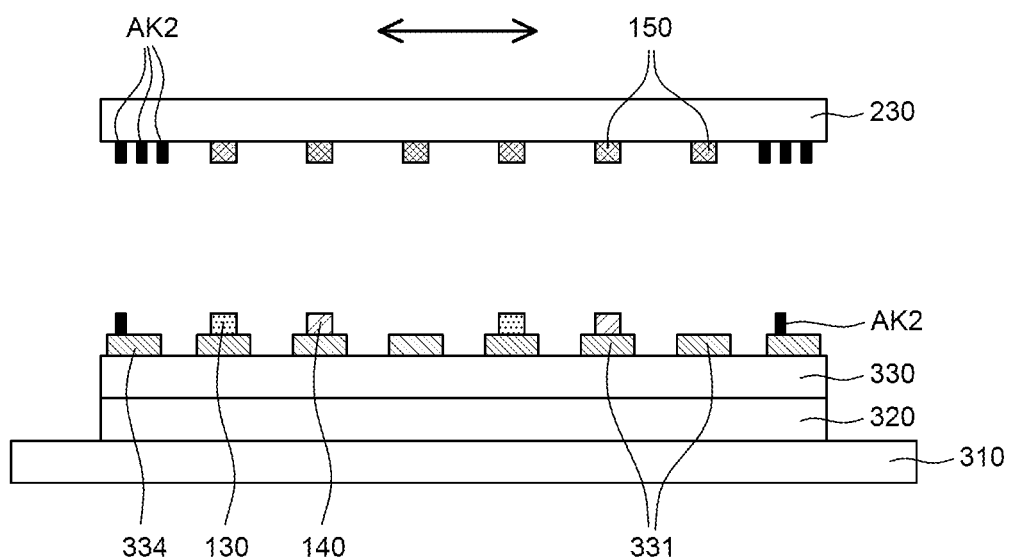

Referring to FIG. 5I, in a state where the third wafer 230 and the donor substrate 300 are disposed such that the plurality of third LEDs 150 on the third wafer 230 and the plurality of protrusions 331 of the donor substrate 300 face each other, the third wafer 230 and the donor substrate 300 may be aligned.

In this case, the first wafer 210 and the donor substrate 300 are aligned based on the first alignment key AK1 and the first alignment protrusion 333. However, the third wafer 230 and the donor substrate 300 may be aligned based on some second alignment keys AK2 used as a reference for alignment with the second wafer 220 among the plurality of second alignment keys AK2 transferred to the donor substrate 300 from the first wafer 210.

Specifically, when the donor substrate 300 on which the plurality of first LEDs 130, the plurality of second alignment keys AK2, and the plurality of second LEDs 140 are disposed is aligned with the third wafer 230, the third wafer 230 and the donor substrate 300 may be aligned based on the second alignment key AK2 used for alignment with the second wafer 220 among the plurality of second alignment keys AK2 of the donor substrate 300. For example, the third wafer 230 and the donor substrate 300 may be aligned based on the second alignment key AK2 used for alignment with the second wafer 220 and the first alignment key AK1 or the second alignment key AK2 of the third wafer 230. Also, for example, the third wafer 230 and the donor substrate 300 may be aligned based on the second alignment key AK2 used for alignment with the second wafer 220 and some of the plurality of third LEDs 150 of the third wafer 230.

Figure 5J:
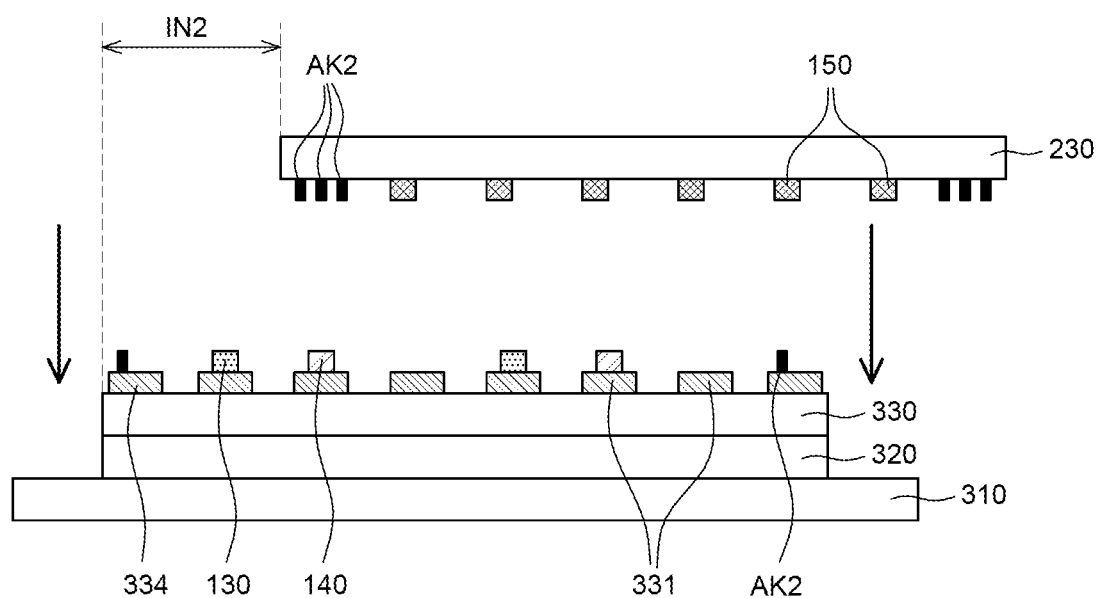

Referring to FIG. 5J, after the alignment between the third wafer 230 and the donor substrate 300 is completed, the third wafer 230 may be shifted by the first interval IN1 twice. After the second wafer 220 is shifted by the first interval IN1, the plurality of second LEDs 140 is transferred to the donor substrate 300. Thus, the third wafer 230 may be shifted by the first interval IN1 twice, i.e., by the second interval IN2, in order to suppress interference with the plurality of first LEDs 130 and the plurality of second LEDs 140 on the donor substrate 3M). Finally, after the third wafer 230 is shifted by the second interval IN2 in the same direction as the shifted direction of the second wafer 220, the plurality of third LEDs 150 is transferred to the donor substrate 300.

Figure 5K:
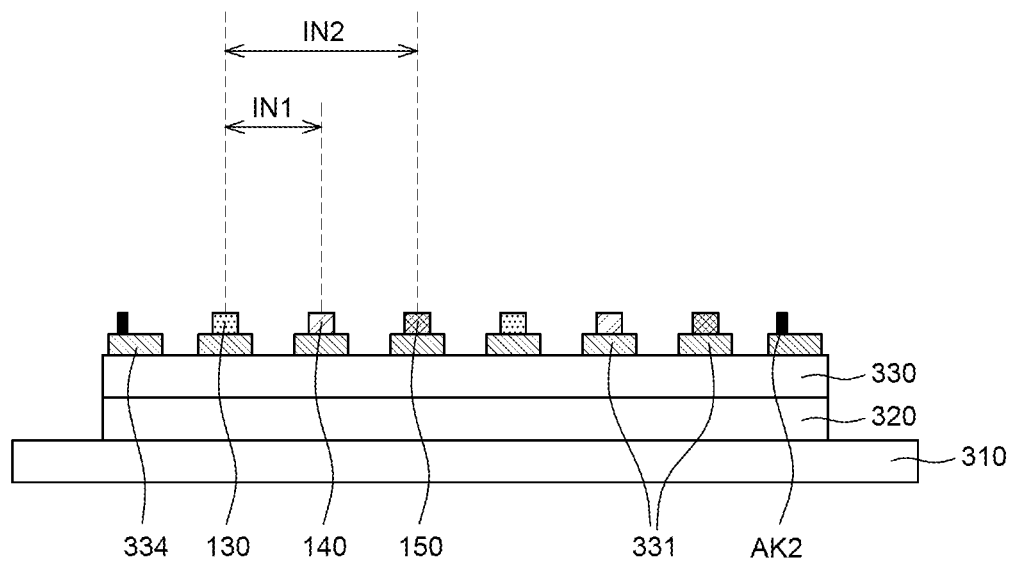
Figure 5L:
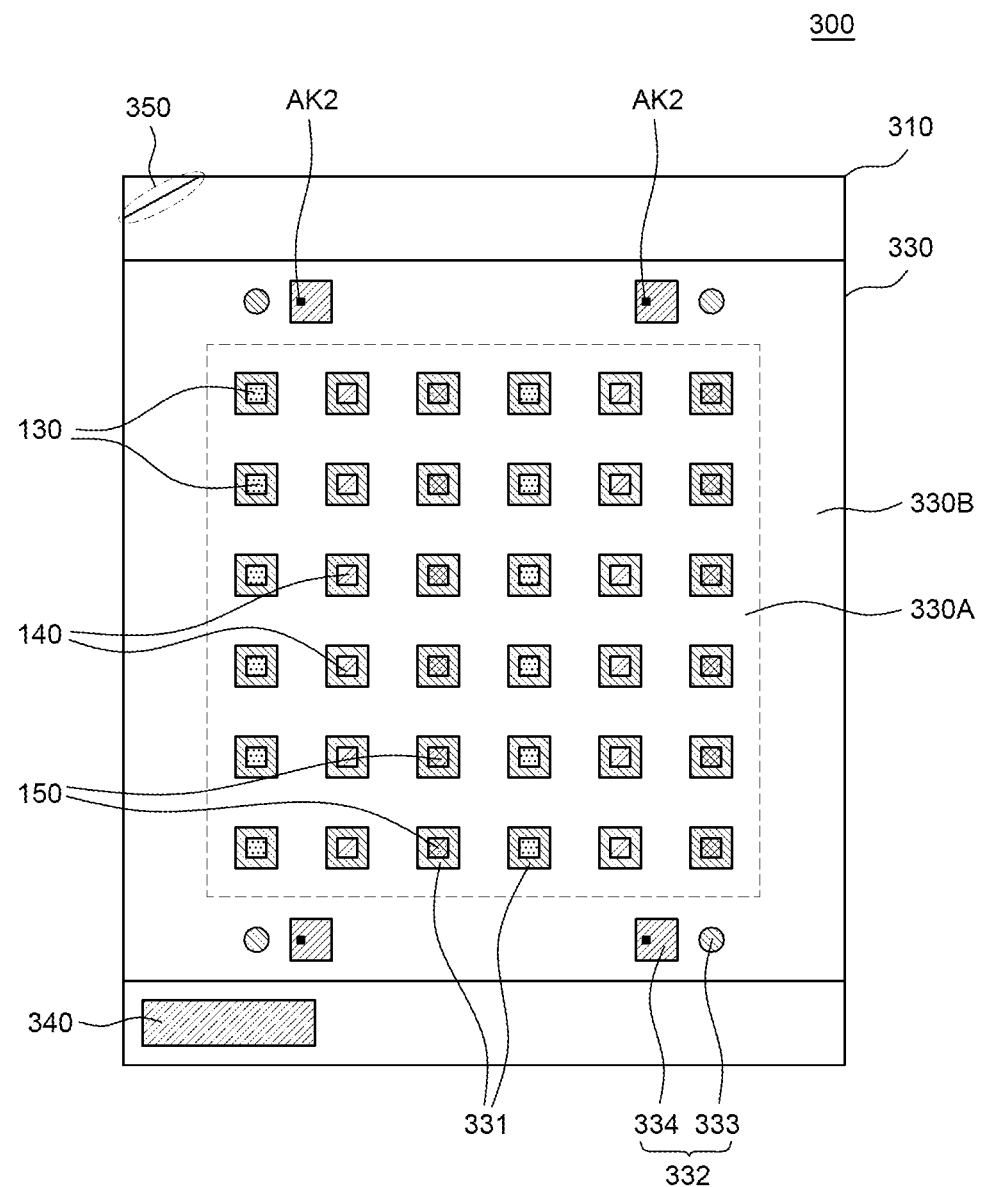

Referring to FIG. 5L and FIG. 5K, the plurality of third LEDs 150 is transferred to the donor substrate 300 (S132). The plurality of third LEDs 150 may be transferred to the protrusions 331 at positions corresponding to the third sub-pixels among the plurality of protrusions 331 of the donor substrate 300. The plurality of third LEDs 150 may be LEDs ED disposed in the third sub-pixels. Thus, the plurality of third LEDs 150 may be transferred only to some protrusions 331 to be aligned corresponding to the third sub-pixels among the plurality of protrusions 331 disposed corresponding to the plurality of sub-pixels.

The plurality of first LEDs 130, the plurality of second LEDs 140, and the plurality of third LEDs 150 may be disposed on the donor substrate 300 at the first interval IN1 which is the interval between the plurality of sub-pixels. For example, even if the plurality of first LEDs 130 and the plurality of second alignment keys AK2 are disposed to deviate from the centers of upper surfaces of the plurality of protrusions 331 and the plurality of second alignment protrusions 334, the plurality of second LEDs 140 and the plurality of third LEDs 150 to be transferred thereafter are transferred based on the second alignment keys AK2 disposed at a predetermined interval from the plurality of first LEDs 130. Therefore, the plurality of second LEDs 140 and the plurality of third LEDs 150 may be disposed to deviate on the plurality of protrusions 331 in the same manner as the plurality of first LEDs 130. Also, a relative position among the plurality of first LEDs 130, the plurality of second LEDs 140, and the plurality of third LEDs 150 may be easily aligned. Accordingly, the relative position among the plurality of first LEDs 130, the plurality of second LEDs 140, and the plurality of third LEDs 150 on the donor substrate 300 may correspond to the plurality of sub-pixels.

After the plurality of third LEDs 150 of the third wafer 230 is transferred to the donor substrate 300, the third wafer 230 and the donor substrate 300 are detached (S133) and the donor substrate 300 to which the third LEDs 150 are transferred is discharged from the process equipment (S134).

Meanwhile, it has been described in the present specification that after the second wafer 220 and the third wafer 230, which have been aligned with the donor substrate 300, are shifted by a predetermined interval, the plurality of second LEDs 140 and the plurality of third LEDs 150 are transferred. However, after the second wafer 220 and the third wafer 230 are shifted by a predetermined interval, a relative position between the second and third wafers 220 and 230 and the donor substrate 300 may be aligned again, but is not limited thereto. That is, the relative position between the second and third wafers 220 and 230 and the donor substrate 300 shifted by a predetermined interval may be aligned once more, and, thus, a relative position between the plurality of second LEDs 140 and the plurality of third LEDs 150 to be transferred to the donor substrate 300 and the plurality of first LEDs 130 on the donor substrate 300 may be more precisely aligned.

Hereinafter, a secondary transfer process by which the plurality of LEDs ED of the donor substrate 300 is transferred to the display panel PN will be described with reference to FIG. 6 and FIG. 7.

Figure 6:
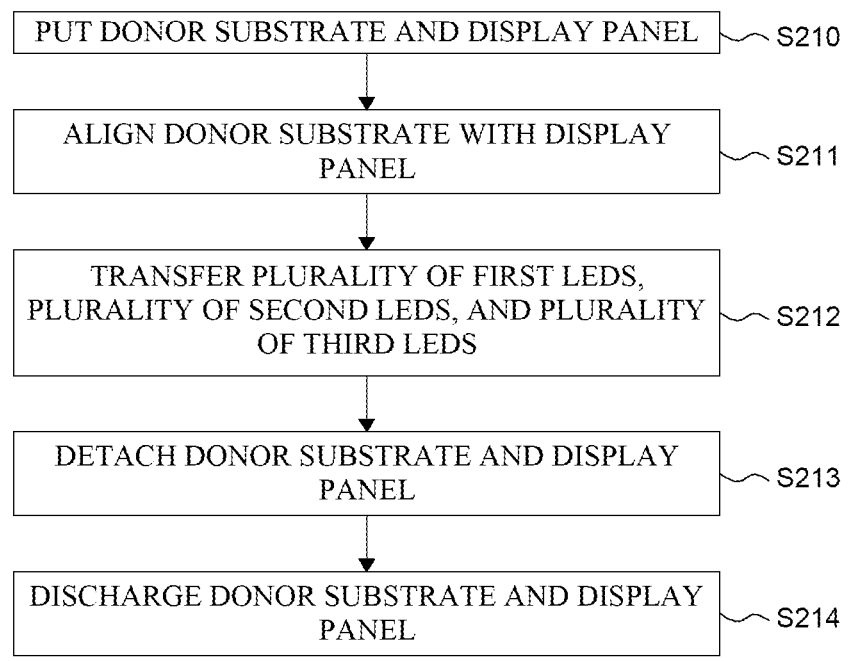
FIG. 6 is a process flowchart for explaining a method of manufacturing a display device according to an exemplary embodiment of the present disclosure.

FIG. 6 is a process flowchart for explaining a method of manufacturing a display device according to an exemplary embodiment of the present disclosure. FIG. 7 is a schematic process diagram for explaining the method of manufacturing a display device according to an exemplary embodiment of the present disclosure. Specifically. FIG. 6 is a flowchart for explaining the secondary transfer process by which the plurality of LEDs ED on the donor substrate 300 is transferred to the display panel PN, and FIG. 7 is a schematic process diagram for explaining the secondary transfer process.

Figure 7:
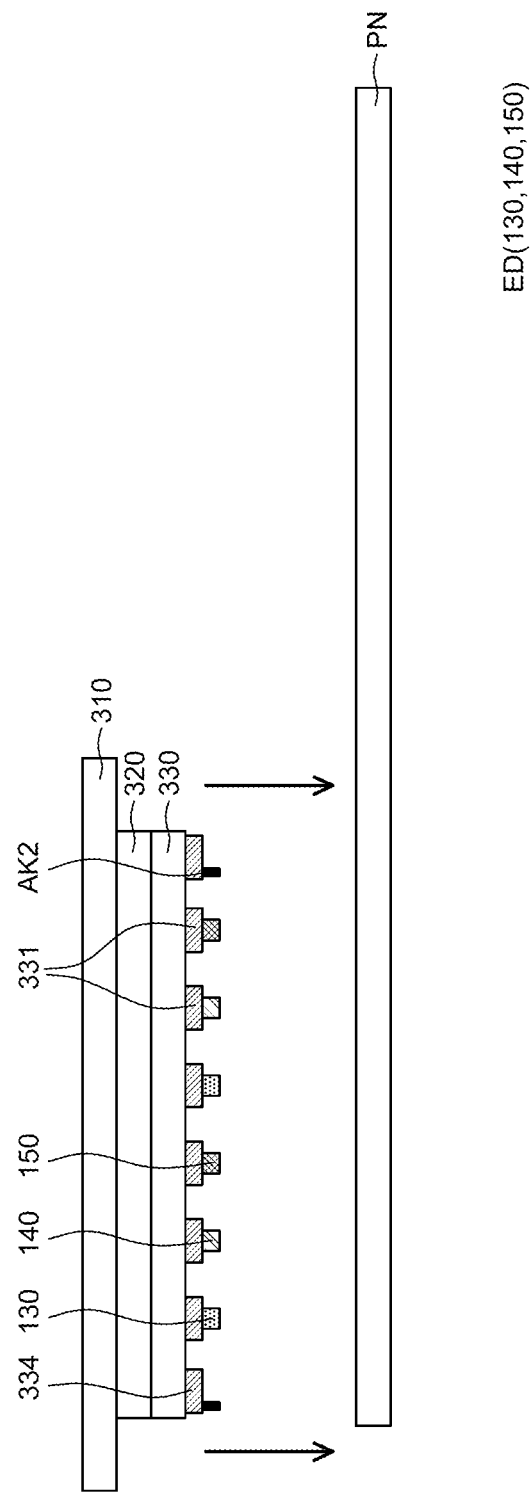
FIG. 7 is a schematic process diagram for explaining the method of manufacturing a display device according to an exemplary embodiment of the present disclosure.

Referring to FIG. 6 and FIG. 7, a secondary transfer process (S200) is performed to transfer the plurality of LEDs ED on the donor substrate 300 to the display panel PN. Accordingly, the manufacturing process of the display device 100 may be completed. In this case, a circuit, e.g., the driving transistor 120 and a plurality of lines, for driving the plurality of LEDs ED has been formed on the display panel PN.

The plurality of first LEDs 130, the plurality of second LEDs 140, and the plurality of third LEDs 150 on the donor substrate 300 are disposed at the same interval in the same placement as the plurality of sub-pixels. Since the plurality of first LEDs 130, the plurality of second LEDs 140, and the plurality of third LEDs 150 on the donor substrate 300 are disposed at the same interval in the same placement as the plurality of sub-pixels, the plurality of first LEDs 130, the plurality of second LEDs 140, and the plurality of third LEDs 150 of the donor substrate 300 may be transferred to the display panel PN at once.

First, the donor substrate 300 on which the plurality of first LEDs 130, the plurality of second LEDs 140, and the plurality of third LEDs 150 are disposed and the display panel PN are input to the process equipment (S210). Then, the donor substrate 300 and the display panel PN are aligned (S211).

In this case, the donor substrate 300 and the display panel PN may be aligned based on the second alignment key AK2 of the donor substrate 300 used for alignment with the second wafer 220 and the third wafer 230 and an alignment key of the display panel PN.

The plurality of second LEDs 140 and the plurality of third LEDs 150 disposed on the donor substrate 300 are transferred not based on the first alignment protrusion 333 of the donor substrate 300, but based on the second alignment key AK2 transferred to the donor substrate 300 from the first wafer 210. That is, an interval between the second alignment key AK2 and the plurality of first LEDs 130 is constant, and an interval of the plurality of second LEDs 140 and the plurality of third LEDs 150, which are transferred to the donor substrate 300 based on the second alignment key AK2, from the second alignment key AK2 may also be constant. Accordingly, the plurality of LEDs ED may be easily transferred corresponding to the plurality of sub-pixels of the display panel PN only when the display panel PN and the donor substrate 300 are aligned based on the second alignment key AK2.

If the donor substrate 300 and the display panel PN are aligned based on another component of the donor substrate 300, the plurality of second LEDs 140 and the plurality of third LEDs 150 may have various intervals from the other component. Therefore, the plurality of second LEDs 140 and the plurality of third LEDs 150 may not be transferred to their correct positions when transferred to the display panel PN. For example, when the donor substrate 300 and the display panel PN are aligned based on the first alignment protrusion 333 of the donor substrate 300, the centers of the upper surfaces of the plurality of protrusions 331 may be aligned corresponding to the plurality of sub-pixels. However, if the donor substrate 300 and the display panel PN are aligned based on the first alignment protrusion 333 when the plurality of first LEDs 130, the plurality of second LEDs 140, and the plurality of third LEDs 150 are disposed on the donor substrate 300 so as to be spaced apart from the centers of the upper surfaces of the plurality of protrusions 331, it may be difficult to transfer the plurality of LEDs ED of the donor substrate 300 to their correct positions in the display panel PN.

Therefore, if the donor substrate 300 and the display panel PN are aligned based on the second alignment key AK2, which is a reference for aligning a relative position of the plurality of first LEDs 130, the plurality of second LEDs 140, and the plurality of third LEDs 150 and has a constant interval from the plurality of LEDs ED, the alignment accuracy for transferring the plurality of LEDs ED to the correct positions may be improved. Therefore, when the plurality of first LEDs 130, the plurality of second LEDs 140, and the plurality of third LEDs 150 of the donor substrate 300 are transferred to the display panel PN, the donor substrate 300 and the display panel PN may be aligned based on the second alignment key AK2 used for alignment with the second wafer 220 and the third wafer 230.

The alignment key of the display panel PN to be aligned with the second alignment key AK2 on the donor substrate 300 may be any one of the components formed on the display panel PN, or may be separately formed and disposed. For example, if the alignment key is any one of the components formed on the display panel PN, a reflective layer overlapping with the plurality of LEDs ED or some of the plurality of wires for driving the plurality of LEDs ED among the components formed on the display panel PN may function as the alignment key. Also, if the alignment key is separately formed and disposed, the alignment key may be a pattern or structure formed on the display panel PN, but is not limited thereto.

Then, after the alignment between the donor substrate 300 and the display panel PN is completed, the plurality of first LEDs 130, the plurality of second LEDs 140, and the plurality of third LEDs 150 are transferred to the display panel PN (S212). Subsequently, after the plurality of LEDs ED of the donor substrate 300 is transferred to the display panel PN, the donor substrate 300 and the display panel PN are detached (S213) and the donor substrate 300 and the display panel PN are discharged from the process equipment (S214).

Therefore, through the primary transfer process of transferring the plurality of LEDs ED to the donor substrate 300 from the wafer 200 and the secondarily transfer process of transferring the plurality of LEDs ED, which has been transferred to the donor substrate 300, to the display panel PN, the manufacturing process of the display device 100 may be completed.

Meanwhile, in the method of manufacturing the display device 100 according to an exemplary embodiment of the present disclosure, the plurality of first LEDs 130, the plurality of second LEDs 140, and the plurality of third LEDs 150 may have the first interval IN1 when transferred to one donor substrate 300 in order to transfer the plurality of first LEDs 130, the plurality of second LEDs 140, and the plurality of third LEDs 150 to the display panel PN at once. In this case, as described above, the plurality of protrusions 331 may have a larger size than the plurality of LEDs ED in consideration of an alignment error between the wafer 200 and the donor substrate 300. When the first wafer 210 and the donor substrate 300 are aligned, the plurality of first LEDs 130 transferred to the plurality of protrusions 331 may be disposed to deviate from the centers of the upper surfaces of the plurality of protrusions 331 due to an alignment error between the first alignment key AK1 and the first alignment protrusion 333. In this case, even if the second wafer 220 and the donor substrate 300 are aligned again based on the first alignment key AK1 of the second wafer 220 and the first alignment protrusion 333 of the donor substrate 300 and the plurality of second LEDs 140 transferred to the plurality of protrusions 331 is disposed at their correct positions, an interval between the plurality of first LEDs 130 and the plurality of second LEDs 140 may be different from the first interval IN1 and alignment accuracy may decrease.

Accordingly, when the second wafer 220 and the donor substrate 300 are aligned, they are aligned based on the second alignment key AK2 disposed at a predetermined interval from the first LED 130. Thus, the plurality of second LEDs 140 may be transferred while maintaining the relative position between the plurality of first LEDs 130 and the plurality of second LEDs 140 transferred onto the donor substrate 300, i.e., the first interval IN1 between the plurality of first LEDs 130 and the plurality of second LEDs 140, and alignment accuracy may be improved.

Meanwhile, it has been illustrated in FIG. 4 through FIG. 7 that the donor substrate 300 is aligned with the second wafer 220 and the third wafer 230 and the donor substrate 300 is aligned with the display panel PN based on the second alignment key AK2 transferred to the donor substrate 300 together with the plurality of first LEDs 130 to be disposed in the outermost first sub-pixels among the plurality of sub-pixels. However, the present disclosure is not limited thereto. The plurality of second LEDs 140 and the second alignment key AK2 of the second wafer 220 to be disposed in the central second sub-pixels among the plurality of sub-pixels may be first transferred to the donor substrate 300. Thereafter, the donor substrate 300 may be aligned with the first wafer 210 and the third wafer 230 and then aligned with the display panel PN based on the second alignment key AK2 from the second wafer 220. Alternatively, the plurality of third LEDs 150 and the second alignment key AK2 of the third wafer 230 to be disposed in the third sub-pixels may be first transferred to the donor substrate 300. Thereafter, the donor substrate 300 may be aligned with the first wafer 210 and the second wafer 220 and then aligned with the display panel PN based on the second alignment key AK2 from the third wafer 230. Therefore, according to the present disclosure, the order of primary transfer processes for the first wafer 210, the second wafer 220, and the third wafer 230 is not limited thereto as long as the remaining wafer 200 and the donor substrate 300 are aligned based on the plurality of LEDs ED and the second alignment key AK2 which are first transferred to the donor substrate 300.

Hereinafter, an effect of improving the alignment accuracy of the plurality of LEDs ED in the method of manufacturing the display device 100 according to an exemplary embodiment of the present disclosure will be described in more detail with reference to FIG. 8 through FIG. 11.

Figure 8:
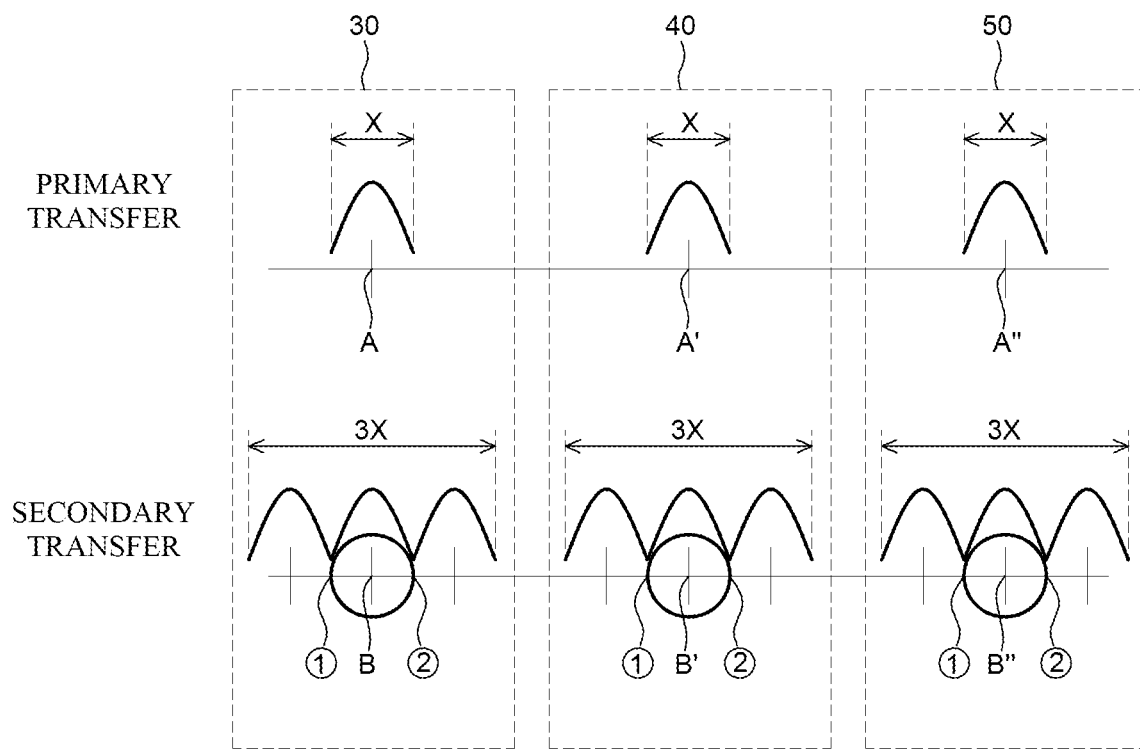
FIG. 8 and FIG. 9 are diagrams for explaining an alignment error range in methods of manufacturing a display device according to comparative embodiments.
Figure 9:
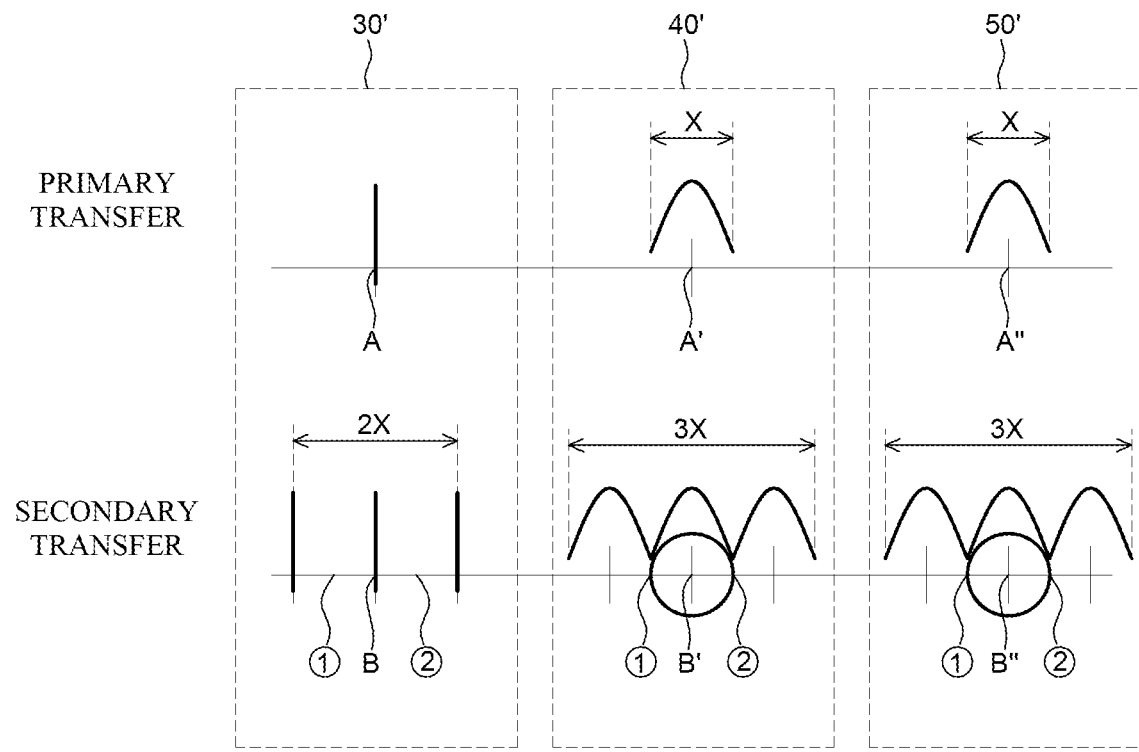
Figure 10:
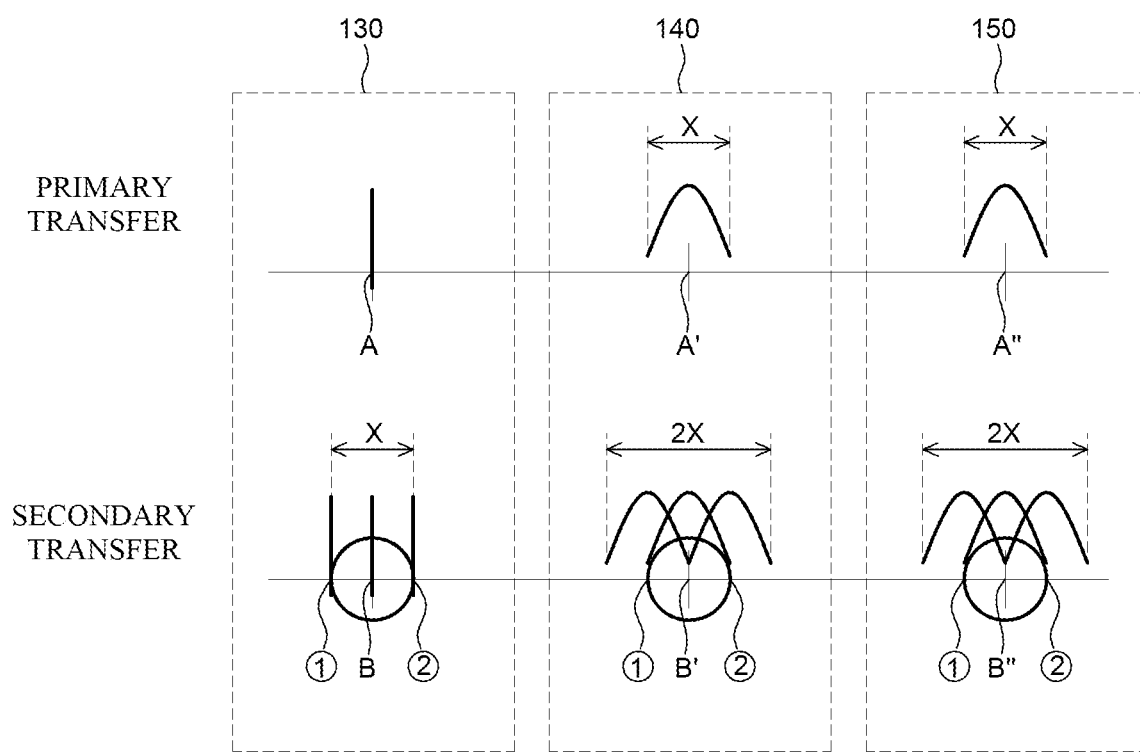
FIG. 10 and FIG. 11 are diagrams for explaining an alignment error range in methods of manufacturing a display device according to exemplary embodiments.
Figure 11:
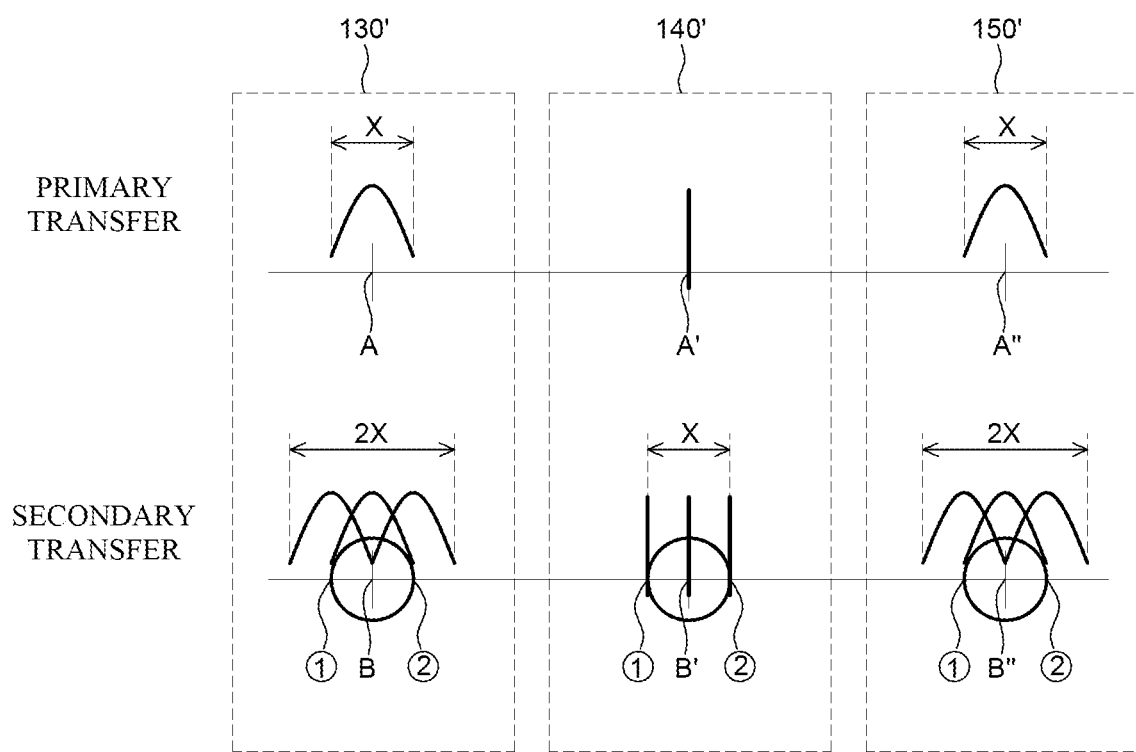

FIG. 8 and FIG. 9 are diagrams for explaining an alignment error range in methods of manufacturing a display device according to comparative embodiments. FIG. 10 and FIG. 11 are diagrams for explaining an alignment error range in methods of manufacturing a display device according to exemplary embodiments. Specifically, FIG. 8 through FIG. 11 are diagrams illustrating ideal correct positions of a plurality of LEDs and dispersion caused by alignment errors during primary and secondary transfer processes. FIG. 8 is a diagram for explaining an alignment error range in a method of manufacturing a display device according to Comparative embodiment 1, and FIG. 9 is a diagram for explaining an alignment error range in a method of manufacturing a display device according to Comparative embodiment 2. FIG. 10 is a diagram for explaining an alignment error range in a method of manufacturing a display device according to Exemplary embodiment 1, and FIG. 11 is a diagram for explaining the alignment error range in a method of manufacturing a display device according to Exemplary embodiment 2.

Meanwhile, alignment error ranges X, 2X, and 3X shown in FIG. 8 through FIG. 11 may be defined as the diameters of the maximum areas up to which a plurality of LEDs and a second alignment key may be transferred while deviating from their correct positions due to an alignment error. The diameters of circles centered at correct position points B, B', and B" shown in FIG. 8 through FIG. 11 are illustrated corresponding to the alignment error range X that may be basically occurred during a secondary transfer process.

The method of Comparative embodiment 1 is different from the method of manufacturing the display device 100 according to an exemplary embodiment of the present disclosure in that during a primary transfer process, a first alignment key of a first wafer is aligned with a first alignment protrusion of a donor substrate to transfer a plurality of first LEDs 30, a first alignment key of a second wafer is aligned with the first alignment protrusion of the donor substrate to transfer a plurality of second LEDs 40, and a first alignment key of a third wafer is aligned with the first alignment protrusion of the donor substrate to transfer a plurality of third LEDs 50. The method of Comparative embodiment 2 is substantially identical to the method of manufacturing the display device 100 according to an exemplary embodiment of the present disclosure except that during a secondary transfer process, a donor substrate and a display panel are aligned based on a second alignment key transferred together with a second LED 40'. The method of Exemplary embodiment 1 is substantially identical to the method of manufacturing the display device 100 according to an exemplary embodiment of the present disclosure in that primary and secondary transfer processes are performed based on the first LED 130 of the outermost sub-pixel, e.g., a first sub-pixel, among the plurality of LEDs. In Exemplary embodiment 2 compared to the method of manufacturing the display device 100 according to an exemplary embodiment of the present disclosure, primary and secondary transfer processes are performed based on a second LED 140' of a central sub-pixel, e.g., the second sub-pixel, among the plurality of LEDs and a second alignment key transferred together with the second LED 140'. Hereinafter, for convenience of description, it is assumed that an error range of alignment between a donor substrate and a wafer during a primary transfer process is X and an error range of alignment between the donor substrate and a display panel during a second transfer process is also X.

Referring to FIG. 8, it can be assumed that during a primary transfer process of transferring a plurality of LEDs to the donor substrate from the wafer, ideal correct positions of the plurality of LEDs transferred onto the donor substrate are a point A, a point A', and a point A", respectively. Specifically, the point A is the correct position of a first LED 30 on the donor substrate, the point A' is the correct position of a second LED 40 on the donor substrate, and the point A" is the correct position of a third LED 50 on the donor substrate.

In the method of manufacturing a display device according to Comparative embodiment 1, a primary transfer process is performed by aligning a first alignment key of each of a plurality of wafers with a first alignment protrusion of a donor substrate, and a secondary transfer process is performed by aligning a display panel and the donor substrate based on a second alignment key transferred from a first wafer among a plurality of second alignment keys on the donor substrate.

In the manufacturing method of a display device according to Comparative embodiment 1, during the primary transfer process, the plurality of first LEDs 30 and the second alignment key of the first wafer may be transferred to the donor substrate. In this case, the first wafer and the donor substrate may be aligned based on a first alignment key of the first wafer and a first alignment protrusion of the donor substrate and dispersion may occur due to an alignment error. For example, when the plurality of first LEDs 30 and the second alignment key are transferred to the donor substrate from the first wafer, dispersion centered at the correct position point A may occur within the alignment error range X.

Specifically, a resin layer, a plurality of protrusions, and a plurality of alignment protrusions of the donor substrate may be made of a material having viscoelasticity, and when the donor substrate is bonded to a wafer, a pressure may be applied to the donor substrate, which may cause deformation of the resin layer, the plurality of protrusions, and the plurality of alignment protrusions. Accordingly, even if the plurality of LEDs and the second alignment key are transferred to their correct positions, the donor substrate may be partially deformed and each of the plurality of transferred LEDs and second alignment key may deviate from their correct positions. Further, an alignment error between the wafer and the donor substrate may also be caused by a process error, and, thus, dispersion of the plurality of LEDs and the second alignment key may occur. In this case, the maximum range up to which deviation from the correct positions can occur may be the alignment error range X. That is, the second alignment key and the plurality of LEDs may be scattered within the dispersion. For example, the second alignment key may deviate most from its correct position within the alignment error range X and may be disposed on the outermost side within the dispersion, and the other plurality of LEDs may be variously disposed within the dispersion. That is, due to a process error, each of the plurality of first LEDs 30 and a plurality of second alignment keys may be scattered within the alignment error range X region and within the dispersion.

After the primary transfer of the plurality of first LEDs 30 and the second alignment key, the plurality of second LEDs 40 and the second alignment key of the second wafer may be transferred to the donor substrate. In this case, the second wafer and the donor substrate may be aligned based on the first alignment key of the second wafer and the first alignment protrusion of the donor substrate. Further, when the plurality of second LEDs 40 and the second alignment key are transferred to the donor substrate from the second wafer, dispersion centered at the correct position point A' may occur within the alignment error range X.

Finally, the plurality of third LEDs 50 and the second alignment key of the third wafer may be transferred to the donor substrate. In this case, the third wafer and the donor substrate may be aligned based on the first alignment key of the third wafer and the first alignment protrusion of the donor substrate. Further, when the plurality of third LEDs 50 and the second alignment key are transferred to the donor substrate from the third wafer, dispersion centered at the correct position point A" may occur within the alignment error range X.

It can be assumed that during a secondary transfer process of transferring the plurality of LEDs to a display panel from the donor substrate, ideal correct positions of the plurality of LEDs transferred onto the display panel are a point B, a point B', and a point B", respectively. Specifically, the point B is the correct position of the first LED 30 and the second alignment key on the display panel, the point B' is the correct position of the second LED 40 and the second alignment key on the display panel, and the point B" is the correct position of the third LED 50 and the second alignment key on the display panel. The correct position point B' of the plurality of second LEDs 40 and the correct position point B" of the plurality of third LEDs 50 are ideal correct positions having the first interval IN1 which is an interval of the plurality of first LEDs 30, the plurality of second LEDs 40, and the plurality of third LED 50 from the plurality of sub-pixels.

Then, the plurality of LEDs and the second alignment key of the donor substrate may be transferred to the display panel. During the secondary transfer process, the plurality of first LEDs 30, the plurality of second LEDs 40, and the plurality of third LEDs 50 may be transferred to be located at the correct position points B, B' and B" on the display panel.

During the secondary transfer process, the donor substrate and the display panel may be aligned based on the second alignment key to transfer the plurality of first LEDs 30, the plurality of second LEDs 40, and the plurality of third LEDs 50 of the donor substrate to the display panel. In this case, the dispersion positions of the plurality of first LEDs 30 and the second alignment key may vary depending on the position of the second alignment key within the dispersion according to the alignment error range X. For example, when the second alignment key at the center within the dispersion is disposed at the correct position point B, the plurality of first LEDs 30 and the second alignment key may show the same dispersion centered at the correct position point B as in the primary transfer process.

However, the second alignment key may deviate from the correct position point B due to an alignment error. For example, the second alignment key may be disposed on the rightmost side within the dispersion of the plurality of first LEDs 30 and the second alignment key, and the plurality of first LEDs 30 may be distributed between the leftmost side and the rightmost side within the dispersion. In this case, during the secondary transfer process based on the second alignment key on the rightmost side within the dispersion, the second alignment key may be biased toward a point ① on the left side of the correct position point B due to a process error. Thus, the resultant dispersion of the plurality of first LEDs 30 and the second alignment key may be shifted to the outside of the point ①. In other words, when the second alignment key is disposed on the rightmost side within the dispersion of the plurality of first LEDs 30 and the second alignment key and the second alignment key is biased toward the point ① on the left side of the correct position point B during the secondary transfer process based on the second alignment key, the dispersion of the plurality of first LEDs 30 and the second alignment key may be shifted to the outside of the point ①. For another example, the second alignment key may be disposed on the leftmost side within the dispersion of the plurality of first LEDs 30 and the second alignment key, and the plurality of first LEDs 30 may be distributed between the rightmost side and the leftmost side within the dispersion. In this case, during the secondary transfer process based on the second alignment key on the leftmost side within the dispersion, the second alignment key may be biased toward a point ② on the right side of the correct position point B due to a process error. Thus, the resultant dispersion of the plurality of first LEDs 30 and the second alignment key may be shifted to the outside of the point ②.

Further, the display panel and the donor substrate are aligned based on the second alignment key transferred from the first wafer during the secondary transfer process, and, thus, the plurality of second LEDs 40 and the plurality of third LEDs 50 disposed on the donor substrate may show the same dispersion as the dispersion of the plurality of first LEDs 30 and the second alignment key. Specifically, the plurality of second LEDs 40 and the plurality of third LEDs 50 disposed on the donor substrate are transferred to the display panel based on the second alignment key from the first wafer. That is, the plurality of second LEDs 40 and the plurality of third LEDs 50 disposed on the donor substrate may be transferred to the display panel while maintaining a relative position with respect to the plurality of first LEDs 30 and the second alignment key. Accordingly, when the second alignment key from the first wafer deviates from the correct position point B, the dispersion of the plurality of second LEDs 40 and the plurality of third LEDs 50 may also be shifted in the same manner as the second alignment key and thus may deviate from their correct position points B' and B", respectively. Therefore, a basic error range of alignment between the display panel and the donor substrate is X, but an alignment error during the primary transfer process is added, and, thus, error ranges of alignment of the plurality of first LEDs 30, the plurality of second LEDs 40, and the plurality of third LEDs 50, respectively, during the secondary transfer process may be up to 3X.

Thereafter, referring to FIG. 9, in the method of manufacturing a display device according to Comparative embodiment 2, a plurality of first LEDs 30', a plurality of second LEDs 40', and a plurality of third LEDs 50' are transferred to one donor substrate, and the plurality of first LEDs 30', the plurality of second LEDs 40', and the plurality of third LEDs 50' of the donor substrate are transferred to a display panel at once. In this case, during a primary transfer process, the plurality of second LEDs 40' of the second wafer and the third LED 50' of the third wafer are transferred to the donor substrate based on a second alignment key transferred together with the plurality of first LEDs 30' and in a secondary transfer process, the plurality of LEDs of the donor substrate is transferred to the display panel based on a second alignment key transferred together with the plurality of second LEDs 40'. That is, during the primary transfer process, the second alignment key transferred together with the first LED 30' may serve as a reference for alignment and during the secondary transfer process, the second alignment key transferred together with the second LED 40' may serve as a reference for alignment.

The plurality of first LEDs 30' and the second alignment key of the first wafer are transferred to the donor substrate. Then, after the second wafer and the third wafer are aligned with the donor substrate based on the second alignment key disposed on the donor substrate, the plurality of second LEDs 40' and the plurality of third LEDs 50' are transferred to the donor substrate. In this case, the second alignment key itself disposed at a predetermined interval from the plurality of first LEDs 30' serves as a reference for alignment between the second and third wafers and the donor substrate, and, thus, an alignment error range and dispersion of the plurality of first LEDs 30' may be ignored. Specifically, even if the plurality of first LEDs 30' deviates from the correct position point A on upper surfaces of the plurality of protrusions of the donor substrate due to an alignment error between the first wafer and the donor substrate, the plurality of second LEDs 40' and the plurality of third LEDs 50' to be transferred thereafter are transferred by aligning their relative position with respect to the second alignment key and the plurality of first LEDs 30'. Thus, the plurality of second LEDs 40' and the plurality of third LEDs 50' may also deviate from the correct position points A' and A" on the upper surfaces of the plurality of protrusions of the donor substrate in the same manner as the plurality of first LEDs 30'. Also, each of the plurality of first LEDs 30', the plurality of second LEDs 40', and the plurality of third LEDs 50' may be disposed at a first interval on the donor substrate. Accordingly, the plurality of first LEDs 30' and the second alignment key disposed at a predetermined interval from the plurality of first LEDs 30' serve as a reference for alignment between the second and third wafers and the donor substrate, and, thus, the alignment error range and dispersion of the plurality of first LEDs 30' may be eliminated.

Meanwhile, the plurality of second LEDs 40' transferred to the donor substrate based on the plurality of first LEDs 30' and the second alignment key disposed on the donor substrate may show dispersion centered at the correct position point A' within the alignment error range X. Likewise, the plurality of third LEDs 50' transferred to the donor substrate based on the plurality of first LEDs 30' and the second alignment key disposed on the donor substrate may show dispersion centered at the correct position point A" within the alignment error range X.

Then, during the secondary transfer process of transferring the plurality of LEDs to the display panel from the donor substrate, the donor substrate and the display panel may be aligned based on the plurality of second LEDs 40' and the second alignment key transferred together with the plurality of second LEDs 40' and then, the plurality of LEDs of the donor substrate may be transferred to the display panel. During the secondary transfer process, the plurality of LEDs may be transferred to be located at the correct position points B, B' and B" on the display panel.

When the plurality of LEDs of the donor substrate is transferred by aligning the donor substrate and the display panel based on the plurality of second LEDs 40' and the second alignment key from the second wafer, the plurality of second LEDs 40' and the second alignment key may change in position based on the correct position point B' depending on an alignment error. For example, if the second alignment key is disposed on the rightmost side within the dispersion of the plurality of second LEDs 40' and the second alignment key, and the second alignment key is transferred to be biased toward a point ①  on the left side of the correct position point B', the dispersion of the plurality of second LEDs 40' and the second alignment key may be shifted to the outside of the point ①. For example, if the second alignment key is disposed on the leftmost side within the dispersion of the plurality of second LEDs 40' and the second alignment key, and the second alignment key is transferred to be biased toward a point ② on the right side of the correct position point B', the dispersion of the plurality of second LEDs 40' and the second alignment key may be shifted to the outside of the point ②. Accordingly, an error range of alignment of the plurality of second LEDs 40' during the secondary transfer process may be up to 3X.

Further, the plurality of first LEDs 30' and the plurality of third LEDs 50' transferred to the display panel based on the second LED 40' from the second wafer and the second alignment key transferred together with the second LED 40' may be transferred onto the display panel while maintaining their relative position with respect to the plurality of second LEDs 40'. If the plurality of second LEDs 40' is biased toward one side of the correct position point B' due to an alignment error during transfer, the plurality of first LEDs 30' and the plurality of third LEDs 50' may also be biased toward one side of the correct position points B and B", respectively, during transfer. For example, if the plurality of second LEDs 40' and the second alignment key are biased toward a point ① on the left side of the correct position point B' during transfer, the plurality of first LEDs 30' and the plurality of third LEDs 50' may also be biased to the point ① on the left side of the correct position points B and B", respectively, during transfer. Accordingly, the plurality of third LEDs 50' may have an alignment error range of 3X with respect to the correct position point B" of the display panel due to the alignment error range 3X of the plurality of second LEDs 40' during the secondary transfer process. However, as for the plurality of first LEDs 30', during the primary transfer process, the plurality of first LEDs 30' and the second alignment key AK2 transferred together with the plurality of first LEDs 30' serve as a reference for alignment and the dispersion of the plurality of first LEDs 30' is eliminated. Therefore, the plurality of first LEDs 30' may have only an alignment error range of 2X during the secondary transfer process.

Referring to FIG. 10, the method of manufacturing a display device according to Exemplary embodiment 1 is substantially identical to the method of manufacturing the display device 100 according to an exemplary embodiment of the present disclosure. First, the plurality of first LEDs 130 of the first wafer 210 may be transferred to the donor substrate 300. Specifically, the first wafer 210 and the donor substrate 300 may be aligned based on the alignment key of the first wafer 210 and the alignment protrusion 332 of the donor substrate 300 in order to transfer the plurality of first LEDs 130 onto the plurality of protrusions 331 of the donor substrate 300.

Then, the plurality of second LEDs 140 and the plurality of third LEDs 150 may be aligned based on the second alignment key AK2 transferred to the donor substrate 300 from the first wafer 210 together with the plurality of first LEDs 130.

In this case, the plurality of second LEDs 140 of the second wafer 220 and the plurality of third LEDs 150 of the third wafer 230 are transferred to the donor substrate 300 based on the second alignment key AK2 transferred to the donor substrate 300 together with the plurality of first LEDs 130. Therefore, an alignment error range and dispersion of the first LEDs 130 transferred to the donor substrate 300 may be ignored. Since the plurality of first LEDs 130 itself serves as a reference for alignment between the second and third wafers 220 and 230 and the donor substrate 300, a relative position between the plurality of first LEDs 130 and the protrusions 331 of the donor substrate 300 is not important as long as the plurality of first LEDs 130 is transferred to the upper surfaces of the protrusions 331 of the donor substrate 300. For example, if the plurality of first LEDs 130 is disposed to be biased toward one side of the protrusions 331 of the donor substrate 300, the second LEDs 140 of the second wafer 220 and the third LEDs 150 of the third wafer 230 are aligned and transferred based on the first LEDs 130. Therefore, the second LEDs 140 and the third LEDs 150 may also be transferred to be biased toward one side of the protrusions 331 of the donor substrate 300. Accordingly, the plurality of first LEDs 130, the plurality of second LEDs 140, and the plurality of third LEDs 150 transferred onto the donor substrate 300 may be disposed at an interval equal to or close to the first interval IN1.

After the second wafer 220 and the third wafer 230 are aligned based on the second alignment key AK2 transferred onto the donor substrate 300 together with the first LED 130, the plurality of second LEDs 140, and the plurality of third LEDs 150 of the second wafer 220 may be transferred to the donor substrate 300. In this case, when the second wafer 220 is aligned based on the second alignment key AK2 transferred together with the first LED 130, dispersion may occur due to an alignment error. For example, the plurality of second LEDs 140 may have an alignment error range X when transferred to the donor substrate 300 from the second wafer 220, and, thus, dispersion centered at the correct position point A' may occur. The plurality of third LEDs 150 may have an alignment error range X when transferred to the donor substrate 300 from the third wafer 230, and, thus, dispersion centered at the correct position point A" may occur.

After the donor substrate 300 and the display panel PN are aligned based on the second alignment key AK2 transferred to the donor substrate 300 together with the first LED 130, the plurality of LEDs ED on the donor substrate 300 may be transferred to the display panel PN. During the secondary transfer process, the plurality of LEDs ED may be transferred to be located at the correct position points B. B' and B" on the display panel PN.

In this case, when the plurality of first LEDs 130 is transferred to the correct position point B on the display panel PN, the plurality of second LEDs 140 and the plurality of third LEDs 150 may also be disposed at the correct position points B' and B". Since the plurality of second LEDs 140 and the plurality of third LEDs 150 on the donor substrate 300 are simultaneously transferred to the display panel PN together with the plurality of first LEDs 130, a relative position of the plurality of second LEDs 140 and the plurality of third LEDs 150 with respect to the plurality of first LEDs 130 may be fixed. Further, the plurality of second LEDs 140 may be transferred to the correct position point B' on the display panel PN according to the dispersion occurring in the primary transfer process. That is, the plurality of second LEDs 140 may show the same dispersion centered at the correct position point B' as in the primary transfer process. Likewise, the plurality of third LEDs 150 disposed on the display panel PN may show the same dispersion centered at the correct position point B" as in the primary transfer process.

Meanwhile, during the secondary transfer process, the first LED 130 may have an alignment error range X, and the first LED 130 may be disposed to be biased toward one side of the correct position point B on the display panel PN due to an alignment error. For example, if the first LED 130 is biased toward a point ① on the left side of the correct position point B during transfer, the plurality of second LEDs 140 disposed on the donor substrate 300 based on the second alignment key AK2 transferred together with the plurality of first LEDs 130 may also be biased toward a point ① on the left side of the correct position point B' and transferred to the display panel PN. The plurality of second LEDs 140 may also show dispersion centered at the point ①. Further, the plurality of third LEDs 150 disposed on the donor substrate 300 based on the second alignment key AK2 transferred together with the plurality of first LEDs 130 may also be biased toward a point ① on the left side of the correct position point B" and transferred to the display panel PN. The plurality of third LEDs 150 may also show dispersion centered at the point ①.

Likewise, if the first LED 130 is biased toward a point ② due to an alignment error during transfer, the plurality of second LEDs 140 disposed on the donor substrate 300 based on the second alignment key AK2 transferred together with the plurality of first LEDs 130 may also be biased toward a point ② on the right side of the correct position point B' and transferred to the display panel PN. The plurality of second LEDs 140 may also show dispersion centered at the point ②. Further, the plurality of third LEDs 150 disposed on the donor substrate 300 based on the second alignment key AK2 transferred together with the plurality of first LEDs 130 may also be biased toward a point ② on the right side of the correct position point B" and transferred to the display panel PN. The plurality of third LEDs 150 may also show dispersion centered at the point ②.

Accordingly, the plurality of first LEDs 130 may have an alignment error range X and the resultant dispersion during the secondary transfer process. Further, the plurality of second LEDs 140 and the plurality of third LEDs 150 may have an alignment error range of 2X with respect to the correct position points B' and B" on the display panel PN due to an alignment error range X during the primary transfer process and the alignment error range X of the plurality of first LEDs 130. However, even if the plurality of second LEDs 140 and the plurality of third LEDs 150 have the alignment error range 2X, a relative position of the plurality of first LEDs 130 with respect to the plurality of second LEDs 140 and the plurality of third LEDs 150, i.e., an interval between the plurality of LEDs ED may be equal to or close to the first interval IN1.

Finally, referring to FIG. 11, in the method of manufacturing a display device according to Exemplary embodiment 2, a plurality of second LEDs 140' and the second alignment key AK2 of a second wafer are first transferred to a donor substrate. Subsequently, a plurality of first LEDs 130' of a first wafer and a plurality of third LEDs 150' of a third wafer may be transferred onto the donor substrate. In this case, the first wafer and the donor substrate may be aligned based on the second alignment key transferred to the donor substrate from the second wafer, and the third wafer and the donor substrate may also be aligned based on the second alignment key transferred to the donor substrate from the second wafer.

Then, after the first wafer aligned with the donor substrate is shifted by a first interval, the plurality of first LEDs 130' may be transferred to one side of the plurality of second LEDs 140', respectively. After the third wafer is shifted by the first interval in a direction opposite to the shifted direction of the first wafer, the plurality of third LEDs 150' may be transferred to the other side of the plurality of second LEDs 140', respectively.

In this case, the plurality of first LEDs 130' of the first wafer and the plurality of third LEDs 150' of the third wafer are transferred to the donor substrate based on the second alignment key transferred together with the plurality of second LEDs 140', and, thus, the alignment error range and dispersion of the plurality of second LEDs 140' transferred to the donor substrate may be eliminated. Specifically, the second alignment key itself disposed at a predetermined interval from the plurality of second LEDs 140' serves as a reference for alignment between the first and third wafers and the donor substrate, and, thus, the alignment error range and dispersion of the plurality of second LEDs 140' may be ignored. Specifically, even if the plurality of second LEDs 140' deviates from the correct position point A' on upper surfaces of a plurality of protrusions of the donor substrate due to an alignment error between the second wafer and the donor substrate, the plurality of first LEDs 130' and the plurality of third LEDs 150' to be transferred thereafter are transferred by aligning their relative position with respect to the second alignment key and the plurality of second LEDs 140'. Thus, the plurality of first LEDs 130' and the plurality of third LEDs 150' may also deviate to be disposed from the correct position points A and A" on the upper surfaces of the plurality of protrusions of the donor substrate in the same manner as the plurality of second LEDs 140'. Also, the plurality of first LEDs 130', the plurality of second LEDs 140', and the plurality of third LEDs 150' may be disposed at a first interval on the donor substrate, respectively. Accordingly, the plurality of second LEDs 140' and the second alignment key disposed at a predetermined interval from the plurality of second LEDs 140' serve as a reference for alignment between the first and third wafers and the donor substrate, and, thus, the alignment error range and dispersion of the plurality of second LEDs 140' may be eliminated.

After the first wafer and the third wafer are aligned based on the second alignment key transferred onto the donor substrate together with the plurality of second LEDs 140', the plurality of first LEDs 130' and the plurality of third LEDs 150' may be transferred to the donor substrate. In this case, when the first wafer is aligned based on the second alignment key transferred together with the plurality of second LEDs 140', dispersion may occur due to an alignment error. For example, the plurality of first LEDs 130' may have an alignment error range X when transferred to the donor substrate from the first wafer, and, thus, dispersion centered at the correct position point A may occur. The plurality of third LEDs 150' may have an alignment error range X when transferred to the donor substrate from the third wafer, and, thus, dispersion centered at the correct position point A" may occur.

After the donor substrate and the display panel are aligned based on the second alignment key transferred to the donor substrate together with the second LED 140', the plurality of LEDs on the donor substrate may be transferred to the display panel. During the secondary transfer process, the plurality of LEDs may be transferred to be located at the correct position points B, B' and B" on the display panel.

In this case, when the plurality of second LEDs 140' and the second alignment key are transferred to the correct position point B' on the display panel, the plurality of first LEDs 130' and the plurality of third LEDs 150' may also be disposed at the correct position points B and B". Since the plurality of first LEDs 130' and the plurality of third LEDs 150' on the donor substrate are simultaneously transferred to the display panel together with the plurality of second LEDs 140', a relative position of the plurality of first LEDs 130' and the plurality of third LEDs 150' with respect to the plurality of second LEDs 140' may be fixed. Further, the plurality of first LEDs 130' may be transferred to the correct position point B on the display panel according to the dispersion occurring in the primary transfer process. That is, the plurality of first LEDs 130' may show the same dispersion centered at the correct position point B as in the primary transfer process. Likewise, the plurality of third LEDs 150' disposed on the display panel may show the same dispersion centered at the correct position point B" as in the primary transfer process.

Meanwhile, during the secondary transfer process, the second LED 140' may have an alignment error range X. and the second LED 140' may be disposed to be biased toward one side of the correct position point B' on the display panel due to an alignment error. For example, if the second LED 140' is biased toward a point ① on the left side of the correct position point B' during transfer, the plurality of first LEDs 130' disposed on the donor substrate based on the second alignment key transferred together with the plurality of second LEDs 140' may also be biased toward a point ① on the left side of the correct position point B and transferred to the display panel. The plurality of first LEDs 130' may also show dispersion centered at the point ①. Further, the plurality of third LEDs 150' disposed on the donor substrate based on the second alignment key transferred together with the plurality of second LEDs 140' may also be biased toward a point ① on the left side of the correct position point B" and transferred to the display panel. The plurality of third LEDs 150' may also show dispersion centered at the point ①.

Likewise, if the second LED 140' is biased toward a point ② on the right side of the correct position point B' due to an alignment error during transfer, the plurality of first LEDs 130' disposed on the donor substrate based on the second alignment key transferred together with the plurality of second LEDs 140' may also be biased toward a point ② on the right side of the correct position point B and transferred to the display panel. The plurality of first LEDs 130' may also show dispersion centered at the point ②. Further, the plurality of third LEDs 150' disposed on the donor substrate based on the second alignment key transferred together with the plurality of second LEDs 140' may also be biased toward a point ② on the right side of the correct position point B" and transferred to the display panel. The plurality of third LEDs 150' may also show dispersion centered at the point ②.

Accordingly, the plurality of second LEDs 140' may have an alignment error range X and the resultant dispersion during the secondary transfer process. Further, the plurality of first LEDs 130' and the plurality of third LEDs 150' may have an alignment error range of 2X with respect to the correct position points B and B" on the display panel due to an alignment error range X during the primary transfer process and the alignment error range X of the plurality of second LEDs 140'. However, even if the plurality of first LEDs 130' and the plurality of third LEDs 150' have the alignment error range 2X, a relative position of the plurality of first LEDs 130' with respect to the plurality of second LEDs 140' and the plurality of third LEDs 150', i.e., an interval between the plurality of LEDs may be equal to or close to the first interval.

In summary, in the method of manufacturing a display device according to Comparative embodiment 1, the first alignment key of each of the plurality of wafers and the first alignment protrusion of the donor substrate may be aligned so that the plurality of LEDs is transferred to the donor substrate, and the display panel and the donor substrate may be aligned based on one of the second alignment keys transferred to the donor substrate so that the plurality of first LEDs 30, the plurality of second LEDs 40, and the plurality of third LEDs 50 may be transferred to the display panel. Therefore, due to an alignment error between the wafer and the donor substrate during the primary transfer process and an alignment error between the donor substrate and the display panel during the secondary transfer process, error ranges of alignment of the plurality of first LEDs 30, the plurality of second LEDs 40 and the plurality of third LEDs 50, respectively, may be up to 3X. Therefore, since the first alignment key of each of the plurality of wafers and the first alignment key of the donor substrate are aligned, an interval among the plurality of first LEDs 30, the plurality of second LEDs 40, and the plurality of third LEDs 50 on the donor substrate may be different from the first interval. Also, even if the plurality of first LEDs 30, the plurality of second LEDs 40, and the plurality of third LEDs 50 are transferred to the display panel, the second alignment key from the first wafer as a reference shows dispersion. If the display panel and the donor substrate are aligned based on the second alignment key showing dispersion, the second alignment key and each of the plurality of LEDs are less likely to be transferred to their correct positions due to a process error. Therefore, it is difficult to precisely align the plurality of first LEDs 30, the plurality of second LEDs 40, and the plurality of third LEDs 50.

In the method of manufacturing a display device according to Comparative embodiment 2, during the primary transfer process of the plurality of first LEDs 30', the plurality of second LEDs 40', and the plurality of third LEDs 50', a relative position of the plurality of first LEDs 30' with respect to the plurality of second LEDs 40' and the plurality of third LEDs 50 is aligned based on the second alignment key transferred together with the plurality of first LEDs 30'. Therefore, during the primary transfer process, dispersion of the plurality of first LEDs 30' caused by an alignment error may be reduced compared to Comparative embodiment 1. However, since the donor substrate and the display panel are aligned based on the plurality of second LEDs 40' showing dispersion and the second alignment key transferred together with the plurality of second LEDs 40' during the secondary transfer process, the plurality of second LEDs 40' and the plurality of third LEDs 50' showing dispersion during the primary transfer process may have an alignment error range of up to 3X, and the plurality of first LEDs 30' from which dispersion has been eliminated during the primary transfer process may also have an alignment error range of up to 2X. Therefore, in Comparative embodiment 2 where the reference for alignment during the primary transfer process is different from the reference for alignment during the secondary transfer process, the error range of alignment of the plurality of LEDs is from 2X to 3X. Therefore, it is difficult to transfer each of the plurality of LEDs to its correct position, and alignment accuracy may decrease.

In the method of manufacturing a display device according to Exemplary embodiment 1, during the primary transfer process, a relative position of the plurality of first LEDs 130 with respect to the plurality of second LEDs 140 and the plurality of third LEDs 150 is aligned by using the second alignment key AK2 transferred together with the plurality of first LEDs 130 as a reference member, and, thus, the alignment error range and dispersion of the plurality of first LEDs 130 during the primary transfer process may be eliminated. Then, even in the secondary transfer process, the donor substrate 300 and the display panel PN are aligned based on the same second alignment key AK2 as in the primary transfer process, and, thus, the plurality of first LEDs 130 may have only an alignment error range of X and the plurality of second LEDs 140 and the plurality of third LEDs 150 transferred based on the plurality of first LEDs 130 may also have only an alignment error range of up to 2X. Therefore, in Exemplary embodiment 1 where the reference for alignment during the primary transfer process is the same as the reference for alignment during the secondary transfer process, the error range of alignment of the plurality of LEDs is from X to 2X. Therefore, each of the plurality of LEDs is more likely to be transferred to its correct position than in Comparative embodiments 1 and 2. Even if an alignment error is taken into consideration, an interval between the plurality of LEDs ED may also be close to the first interval IN1. Therefore, alignment accuracy may be improved.

The method of manufacturing a display device according to Exemplary embodiment 2 is different from the method of Exemplary embodiment 1 only in that the plurality of second LEDs 140' transferred to the second sub-pixels, which are central sub-pixels, and the second alignment key transferred together with the plurality of second LEDs 140' serve as a reference for alignment. In the method of manufacturing a display device according to Exemplary embodiment 2, during the primary transfer process, the plurality of second LEDs 140' and the second alignment key of the second wafer are first transferred to the donor substrate and a relative position of the plurality of second LEDs 140' with respect to the plurality of first LEDs 130' and the plurality of third LEDs 150' is aligned based on the second alignment key from the second wafer. Since the second alignment key that maintains a predetermined interval from the plurality of second LEDs 140' is used as a reference member during the primary transfer process, the alignment error range and dispersion of the plurality of second LEDs 140' may be eliminated. Then, even in the secondary transfer process, the donor substrate and the display panel are aligned based on the same second alignment key as in the primary transfer process. Thus, the plurality of second LEDs 140' may have only an alignment error range of X and the plurality of first LEDs 130' and the plurality of third LEDs 150' transferred based on the plurality of second LEDs 140' may also have only an alignment error range of up to 2X. Therefore, in Exemplary embodiment 2 where the reference for alignment during the primary transfer process is the same as the reference for alignment during the secondary transfer process, the error range of alignment of the plurality of LEDs is from X to 2X. Therefore, each of the plurality of LEDs is more likely to be transferred to its correct position than in Comparative embodiments 1 and 2. Even if an alignment error is taken into consideration, an interval between the plurality of LEDs may also be close to the first interval. Therefore, alignment accuracy may be improved.

Therefore, in the display device 100 according to an exemplary embodiment of the present disclosure, based on the second alignment key AK2 transferred together with the plurality of LEDs ED during the primary transfer process and maintaining the same interval from the plurality of LEDs ED all the time, a relative position with respect to the other LEDs ED to be transferred to the donor substrate 300 is aligned. Thus, an alignment error range of the plurality of LEDs ED may be reduced and alignment accuracy may be improved. Specifically, as for the first wafer 210 aligned with the donor substrate 300 first, the donor substrate 300 and the first wafer 210 are aligned based on the first alignment key AK1 of the first wafer 210 and the first alignment protrusion 333 of the donor substrate 300 so that the plurality of first LEDs 130 and the plurality of second alignment keys AK2 are transferred to the upper surfaces of the plurality of protrusions 331 and the plurality of second alignment protrusions 334, respectively. After the plurality of first LEDs 130 and the plurality of second alignment keys AK2 are transferred together to the donor substrate 300, the second wafer 220 and the third wafer 230 may be aligned with the donor substrate 300 based on the plurality of second alignment keys AK2. Even in the secondary transfer process, the donor substrate 300 and the display panel PN may be aligned based on the same second alignment keys AK2. The second alignment key AK2 transferred to the donor substrate 300 together with the plurality of first LEDs 130 may maintain the same interval from each of the plurality of first LEDs 130. Accordingly, when the second wafer 220 and the third wafer 230 are aligned with the donor substrate 300 based on the second alignment key AK2, a relative position may be aligned in order for the plurality of second LEDs 140 of the second wafer 220 and the plurality of first LEDs 130 of the donor substrate 300 to have the first interval IN1. Also, a relative position may be aligned in order for the plurality of third LEDs 150 of the third wafer 230 and the plurality of first LEDs 130 and the plurality of second LEDs 140 of the donor substrate 300 to have the first interval IN1. Accordingly, the alignment error range and dispersion of the plurality of first LEDs 130 serving as a reference during the primary transfer process may be eliminated. Also, the plurality of second LEDs 140 and the plurality of third LEDs 150 with which the relative position of the plurality of first LEDs 130 is aligned may have only a minimum alignment error range and dispersion. Further, even in the secondary transfer process, the second alignment key AK2, which has been a reference for alignment of the plurality of first LEDs 130, the plurality of second LEDs 140, and the plurality of third LEDs 150, is used as a reference member, and, thus, it is possible to minimize an alignment error range and dispersion of the plurality of first LEDs 130, the plurality of second LEDs 140, and the plurality of third LEDs 150 caused by an alignment error. Furthermore, according to Exemplary embodiment 2, in the display device 100 according to an exemplary embodiment of the present disclosure, based on the second alignment key AK2 transferred together with the plurality of LEDs ED, a relative position between the other LEDs ED and an LED ED disposed on the donor substrate 300 is aligned. Thus, each of the plurality of LEDs ED may be disposed corresponding to an interval between the plurality of sub-pixels, and the alignment accuracy of the plurality of LEDs ED may be improved.

In the method of manufacturing the display device 100 according to an exemplary embodiment of the present disclosure, a high-resolution display device 100 may be manufactured by precisely aligning a plurality of micro-sized LEDs ED. As the size of the plurality of LEDs ED decreases, a higher-quality image may be displayed, which may be advantageous for implementing high resolution. However, as the size of the plurality of LEDs ED decreases, it is difficult to align each of the plurality of LEDs ED during the transfer of the plurality of LEDs ED, and alignment accuracy may decrease. However, in the method of manufacturing the display device 100 according to an exemplary embodiment of the present disclosure, a relative position between the plurality of LEDs ED on the donor substrate 300 and the plurality of LEDs ED on the wafer 200 instead of a relative position between the donor substrate 300 and the wafer 200 is aligned. Thus, the alignment accuracy of the plurality of LEDs ED transferred onto the donor substrate 300 may be improved. Accordingly, even if the plurality of LEDs ED has a micro size, the plurality of LEDs ED may be easily aligned and the high-resolution display device 100 may be easily manufactured.

Conventionally, only LEDs emitting light of the same color are transferred to one donor substrate and then secondarily transferred again to a display panel. In this case, a second alignment key of a wafer is transferred to the donor substrate for alignment between the donor substrate and the display panel. However, it is difficult to transfer the second alignment key with the same mask and laser as the plurality of LEDs. Thus, a separate process for transferring the second alignment key to the donor substrate is performed. For example, a second alignment key of a first wafer is transferred to one donor substrate to align the donor substrate and the display panel, a second alignment key of a second wafer is transferred to another donor substrate to align the donor substrate and the display panel, and a second alignment key of a third wafer is transferred to yet another donor substrate to align the donor substrate and the display panel. Therefore, in order to align each of one donor substrate, another donor substrate and yet another donor substrate with the display panel, a separate process of transferring the second alignment key is needed, and, thus, the transfer process time and cost increase.

However, in the method of manufacturing the display device 100 according to an exemplary embodiment of the present disclosure, the process time and cost may be reduced by shortening time required for the primary transfer process. First, in the method of manufacturing the display device 100 according to an exemplary embodiment of the present disclosure, a plurality of LEDs ED from a plurality of wafers 200 is primarily transferred to one donor substrate 300. In this case, a plurality of second alignment keys AK2 may be transferred to the donor substrate 300 from one wafer 200 to which the primary transfer process is first performed. Then, when a plurality of LEDs ED of the other wafers 200 is transferred to the donor substrate 300 during the primary transfer process, there is no need to transfer the second alignment keys AK2 since the second alignment keys AK2 are already disposed on the donor substrate 300. Conventionally, the second alignment keys AK2 need to be transferred three times during the primary transfer process. However, according to the present disclosure, the second alignment keys AK2 are transferred only once during the primary transfer process so that the donor substrate 300 and the display panel PN may be easily aligned during the secondary transfer process. Therefore, in the method of manufacturing the display device 100 according to an exemplary embodiment of the present disclosure, some processes for transferring the plurality of second alignment keys AK2 to the donor substrate 300 are omitted. Thus, the processing time and cost may be reduced.

In the method of manufacturing the display device 100 according to an exemplary embodiment of the present disclosure, a plurality of first LEDs 130, a plurality of second LEDs 140, and a plurality of third LEDs 150 are transferred onto one donor substrate 300 so as to correspond to a plurality of sub-pixels, respectively. Thus, it is possible to simplify the secondary transfer process. Conventionally, only one type of LEDs emitting light of the same color is primarily transferred to one donor substrate and then secondarily transferred to a display panel. Accordingly, in order to form one pixel including a first LED, a second LED, and a third LED, each of the primary transfer processes and the secondary transfer processes needs to be performed at least three times. However, in the method of manufacturing the display device 100 according to an exemplary embodiment of the present disclosure, a plurality of first LEDs 130, a plurality of second LEDs 140, and a plurality of third LEDs 150 are primarily transferred onto one donor substrate 300 so as to correspond to a plurality of sub-pixels, respectively, and the plurality of first LEDs 130, the plurality of second LEDs 140, and the plurality of third LEDs 150 disposed on the donor substrate 300 are transferred to the display panel PN at a time. Accordingly, the display device 100 may be manufactured. Therefore, one pixel PX including the first LED 130, the second LED 140, and the third LED 150 may be formed just by performing the primary transfer process three times and the secondary transfer process one time. Therefore, in the method of manufacturing the display device 100 according to an exemplary embodiment of the present disclosure, productivity and yield may be improved by forming an integrated donor substrate 300 on which the plurality of LEDs ED is transferred corresponding to the plurality of sub-pixels, respectively.

Figure 12A:
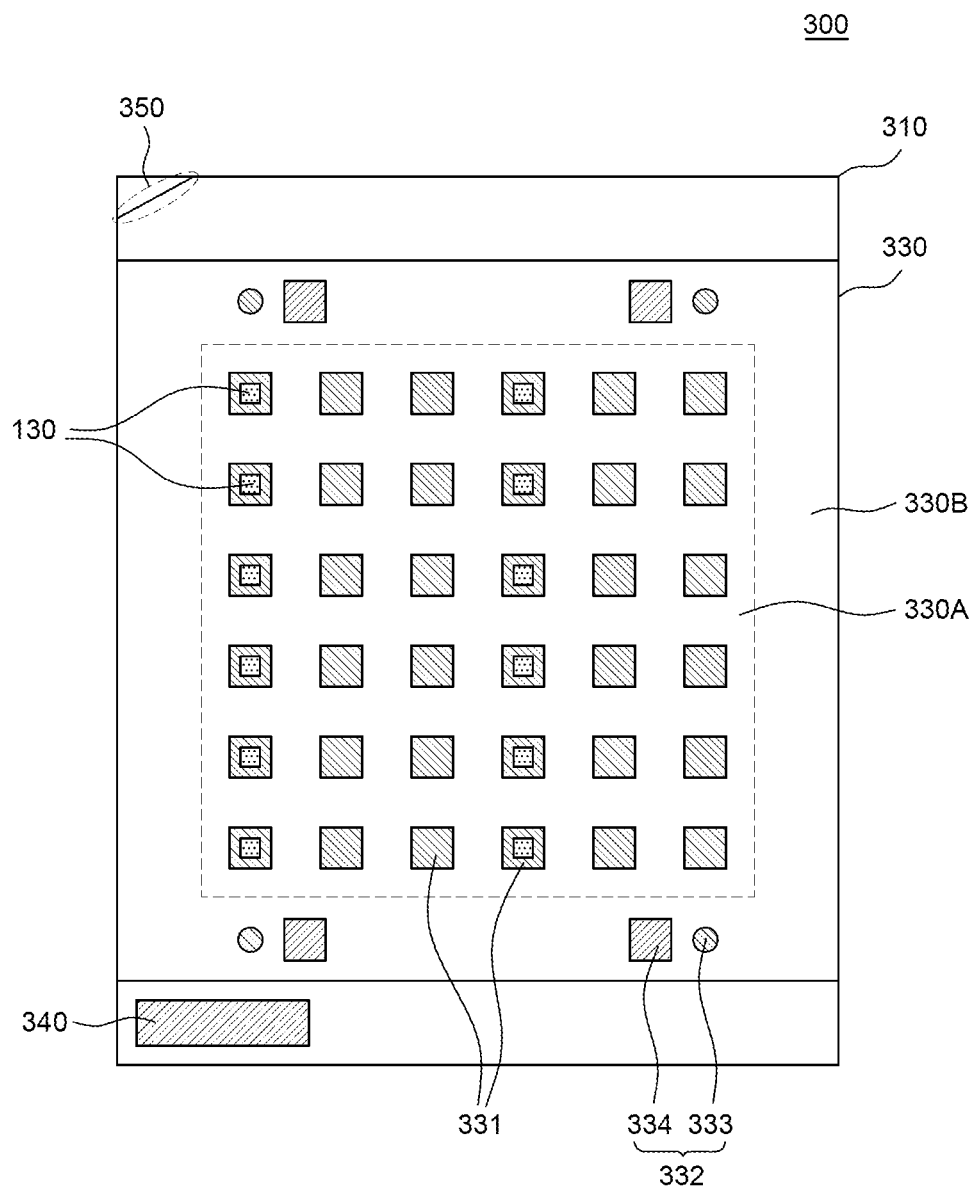
FIG. 12A through FIG. 12E are process flowcharts for explaining a method of manufacturing a display device according to another exemplary embodiment of the present disclosure.

FIG. 12A through FIG. 12E are process flowcharts for explaining a method of manufacturing a display device according to another exemplary embodiment of the present disclosure. FIG. 13 is a process flowchart for explaining the method of manufacturing a display device according to another exemplary embodiment of the present disclosure. Specifically, FIG. 12A through FIG. 12E are schematic process diagrams for explaining a primary transfer process, and FIG. 13 is a schematic process diagram for explaining a secondary transfer process. The method of manufacturing a display device shown in FIG. 12A through FIG. 13 is substantially the same as the method of manufacturing a display device shown in FIG. 1 through FIG. 7 except that a reference member for aligning the wafer 200 with the donor substrate 300 and the donor substrate 300 with the display panel PN is one of the plurality of LEDs ED. Therefore, a redundant description thereof will be omitted.

Figure 12B:
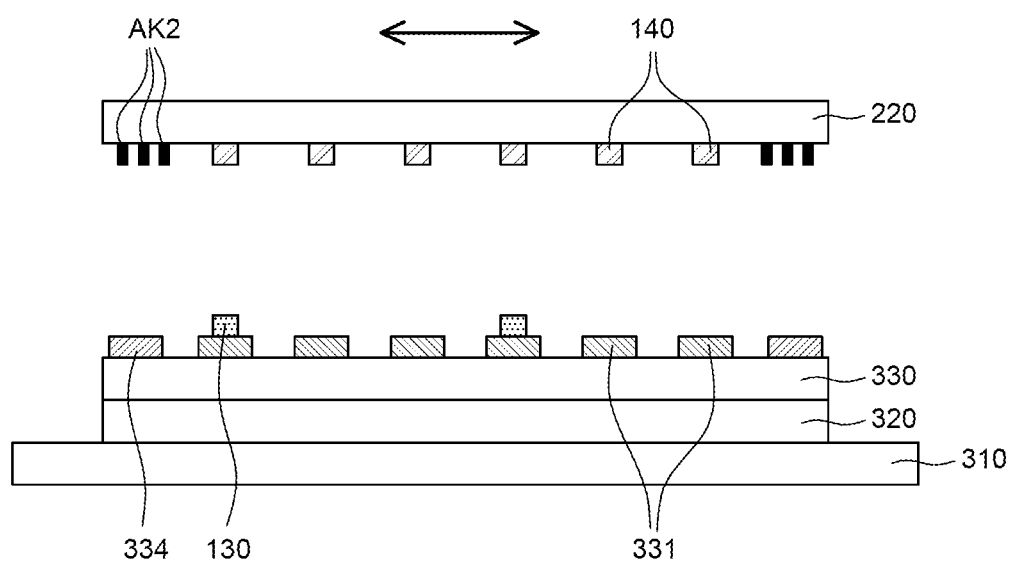
Figure 13:
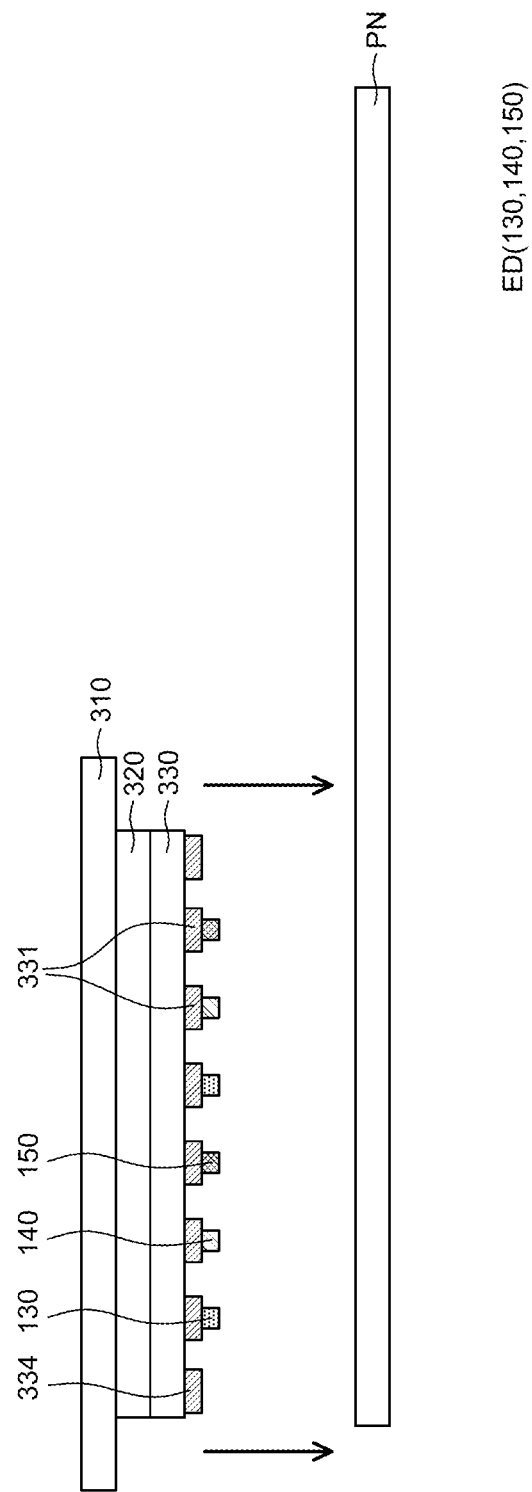
FIG. 13 is a process flowchart for explaining the method of manufacturing a display device according to another exemplary embodiment of the present disclosure.

Referring to FIG. 12A and FIG. 12B, after the primary transfer process of the plurality of first LEDs 130 to the donor substrate 300 from the first wafer 210 is completed, the plurality of second LEDs 140 of the second wafer 220 is transferred to the donor substrate 300.

In a state where the donor substrate 300 and the second wafer 220 are disposed such that the plurality of protrusions 331 of the donor substrate 300 and the plurality of second LEDs 140 of the second wafer 220 face each other, the donor substrate 300 and the second wafer 220 may be aligned.

In this case, the donor substrate 300 and the second wafer 220 may be aligned based on some of the plurality of first LEDs 130 transferred to the donor substrate 300 from the first wafer 210 and any one of the components of the second wafer 220. For example, the second wafer 220 and the donor substrate 300 may be aligned based on some of the plurality of first LEDs 130 transferred to the donor substrate 300 from the first wafer 210 and the first alignment key AK1 or the second alignment key AK2 of the second wafer 220, or the second wafer 220 and the donor substrate 300 may be aligned based on some of the plurality of first LEDs 130 transferred to the donor substrate 300 and some of the plurality of second LEDs 140 of the second wafer 220.

For example, when the second wafer 220 and the donor substrate 300 are aligned based on the first LED 130 of the donor substrate 300 and the second alignment key AK2 of the second wafer 220, the second wafer 220 and the donor substrate 300 may be aligned such that the center of the first LED 130 matches the center of the second alignment key AK2. Then, the donor substrate 300 and the second wafer 220 may be aligned by shifting the second wafer 220 or the donor substrate 300 such that the active region 200A of the second wafer 220 and the transfer area 330A of the donor substrate 300 correspond to each other.

For another example, when the second wafer 220 and the donor substrate 300 are aligned based on the first LED 130 of the donor substrate 300 and the second LED 140 of the second wafer 220, the second wafer 220 and the donor substrate 300 may be aligned such that the center of the first LED 130 matches the center of the second LED 140. In this case, depending on the positions of the first LED 130 and the second LED 140 serving as reference members, the donor substrate 300 and the second wafer 220 may be aligned by shifting the second wafer 220 or the donor substrate 300 such that the active region 200A of the second wafer 220 and the transfer area 330A of the donor substrate 300 correspond to each other, or the process of shifting the second wafer 220 or the donor substrate 300 may be omitted.

In this case, the center of the first LED 130 may be defined as the center of a shape formed by the edges of the first LED 130 when the first LED 130 serving as a reference member is viewed from the top. For example, when the first LED 130 serving as a reference member is viewed from the top, the edges of the first LED 130 may form a square shape, and the donor substrate 300 and the second wafer 220 may be aligned based on the center of the square shape.

Figure 12C:
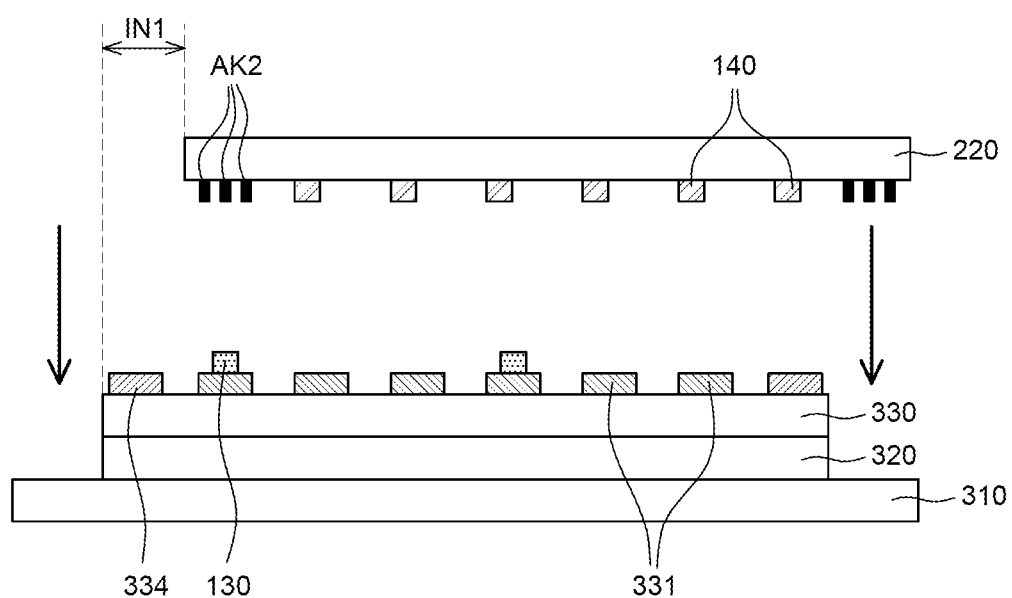

Referring to FIG. 12C, after the alignment between the second wafer 220 and the donor substrate 300 is completed, the second wafer 220 may be shifted by the first interval IN1. After the second wafer 220 is shifted by the first interval IN1, i.e., the interval between the plurality of sub-pixels, the plurality of second LEDs 140 is transferred to the donor substrate 300.

Figure 12D:
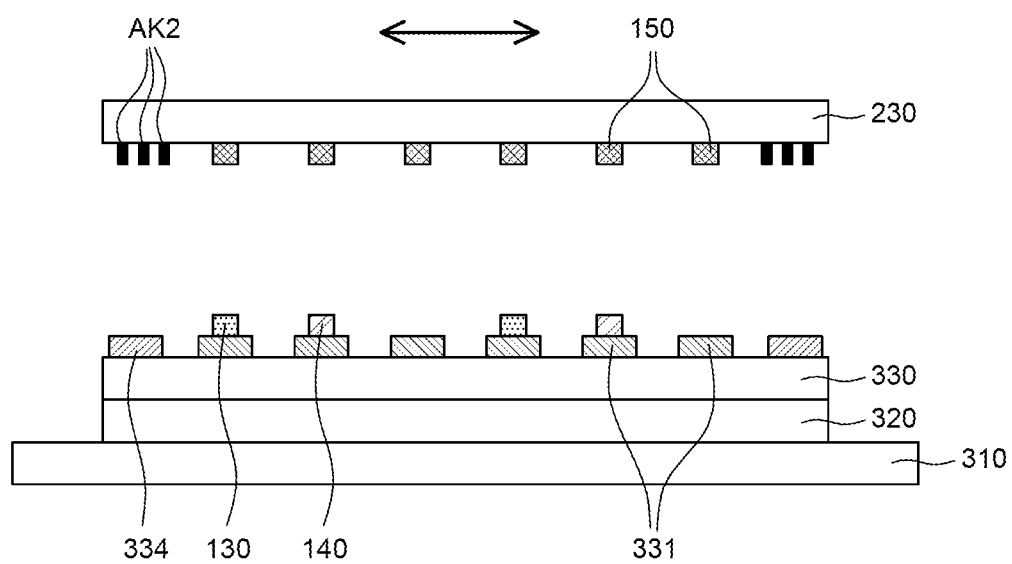
Figure 12E:
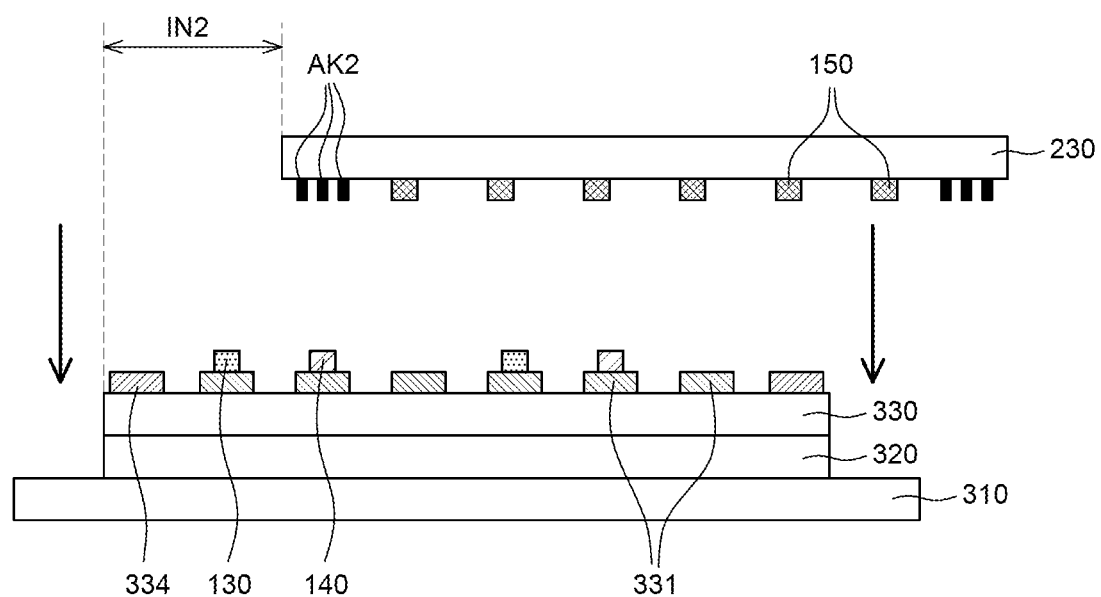

Then, referring to FIG. 12D and FIG. 12E, after the primary transfer process of the plurality of second LEDs 140 is completed, the plurality of third LEDs 150 of the third wafer 230 is transferred to the donor substrate 300.

First, referring to FIG. 12D, in a state the donor substrate 300 and the third wafer 230 are disposed such that the plurality of protrusions 331 of the donor substrate 300 and the plurality of third LEDs 150 of the third wafer 230 face each other, the donor substrate 300 and the third wafer 230 may be aligned.

In this case, the donor substrate 300 and the third wafer 230 may be aligned based on some of the plurality of first LEDs 130 transferred to the donor substrate 300 from the first wafer 210 and any one of the components of the third wafer 230. For example, the third wafer 230 and the donor substrate 300 may be aligned based on some of the plurality of first LEDs 130 transferred to the donor substrate 300 from the first wafer 210 and the first alignment key AK1 or the second alignment key AK2 of the third wafer 230, and the second wafer 220 and the donor substrate 300 may be aligned based on some of the plurality of first LEDs 130 transferred to the donor substrate 300 and some of the plurality of second LEDs 140 of the second wafer 220.

Referring to FIG. 12E, after the alignment between the third wafer 230 and the donor substrate 300 is completed, the third wafer 230 may be shifted by the second interval IN2. That is, after the third wafer 230 is shifted by the first interval IN1 twice, the plurality of third LEDs 150 is transferred to the donor substrate 300.

In this case, the plurality of first LEDs 130, the plurality of second LEDs 140, and the plurality of third LEDs 150 transferred to the donor substrate 300 may be transferred at the first interval IN1, which is the interval between the plurality of sub-pixels, to the display panel PN at a time. Accordingly, when the plurality of second LEDs 140 and the plurality of third LEDs 150 are transferred to the donor substrate 300, the second wafer 220 and the third wafer 230 may be aligned with the donor substrate 300 by using some of the plurality of first LEDs 130 on the donor substrate 300 as a reference member. Also, a relative position among the plurality of first LEDs 130, the plurality of second LEDs 140, and the plurality of third LEDs 150 may be aligned.

Meanwhile, when the plurality of first LEDs 130 is transferred to the donor substrate 300 from the first wafer 210, the second alignment key AK2 may or may not be transferred. Also, when the plurality of LEDs ED is transferred to the display panel PN from the donor substrate 300, the second alignment key AK2 may or may not be transferred. In the method of manufacturing a display device according to another exemplary embodiment of the present disclosure, when the donor substrate 300 and the display panel PN are aligned, the first LED 130 is used as a reference member instead of the second alignment key AK2. Thus, the second alignment key AK2 may be selectively transferred.

The plurality of second LEDs 140 and the plurality of third LEDs 150 disposed on the donor substrate 300 are transferred not based on the first alignment protrusions 333 of the donor substrate 300, but based on some of the plurality of first LEDs 130 transferred to the donor substrate 300 from the first wafer 210. A relative position of the plurality of second LEDs 140 and the plurality of third LEDs 150 transferred to the donor substrate 300 based on the plurality of first LEDs 130 with respect to the plurality of first LEDs 130 may be aligned. Accordingly, the plurality of first LEDs 130, the plurality of second LEDs 140, and the plurality of third LEDs 150 may be disposed on the donor substrate 300 so as to correspond to the plurality of sub-pixels. Further, when the plurality of first LEDs 130, the plurality of second LEDs 140, and the plurality of third LEDs 150 are transferred to the display panel PN, the donor substrate 300 and the display panel PN may be aligned based on the plurality of first LEDs 130 to transfer the plurality of first LEDs 130, the plurality of second LEDs 140, and the plurality of third LEDs 150. In this case, the plurality of first LEDs 130, the plurality of second LEDs 140, and the plurality of third LEDs 150 may be transferred corresponding to the plurality of sub-pixels, respectively.

Therefore, in the method of manufacturing a display device according to another exemplary embodiment of the present disclosure, the second wafer 220 and the third wafer 230 may be aligned with the donor substrate 300 based on some of the plurality of first LEDs 130 first transferred onto the donor substrate 300. Thus, the alignment accuracy of the plurality of first LEDs 130, the plurality of second LEDs 140, and the plurality of third LEDs 150 may be improved. Specifically, without a separate component to align the wafer 200 with the donor substrate 300 and the donor substrate 300 with the display panel PN, the donor substrate 300 may be aligned with the wafer 200 and the display panel PN based on one of the plurality of first LEDs 130. Accordingly, the structures of the wafer 200, the donor substrate 300, and the display panel PN may be simplified, and the transfer process of the second alignment key AK2 may be simplified. The second alignment key AK2 may have a different shape from the plurality of LEDs ED and may be individually transferred. That is, since the second alignment key AK2 has a different shape from the plurality of first LEDs 130, a mask or laser used in the transfer process may be different. Also, it is difficult to simultaneously transfer the second alignment key AK2 with the plurality of first LEDs 130, and the second alignment key AK2 may be transferred in a separate process from the plurality of first LEDs 130. However, in the method of manufacturing a display device according to another exemplary embodiment of the present disclosure, the plurality of LEDs ED itself is used as a reference member for aligning the wafer 200 with the donor substrate 300 and the donor substrate 300 with the display panel PN. Accordingly, the transfer process of the second alignment key AK2 may be simplified, and the structures of the wafer 200 and the donor substrate 300 may be simplified.

The exemplary embodiments of the present disclosure can also be described as follows:

According to an aspect of the present disclosure, there is provided a method of manufacturing a display device. The method of manufacturing a display device includes a process of aligning a first wafer on which a plurality of first LEDs, a plurality of alignment keys, and a reference member are disposed with a donor substrate, a process of transferring the plurality of first LEDs and the reference member on the first wafer to the donor substrate, and a process of aligning a second wafer on which a plurality of second LEDs is disposed with the donor substrate based on the reference member.

In the process of aligning the first wafer with the donor substrate, the first wafer may be aligned with the donor substrate based on a first alignment key among the plurality of alignment keys of the first wafer and a first alignment protrusion of the donor substrate.

The method of manufacturing a display device may further include a process of transferring the plurality of second LEDs on the second wafer to the donor substrate on which the plurality of first LEDs is disposed, a process of aligning a third wafer on which a plurality of third LEDs is disposed with the donor substrate based on the reference member, and a process of transferring the plurality of third LEDs on the third wafer to the donor substrate on which the plurality of first LEDs and the plurality of second LEDs are disposed.

The method of manufacturing a display device may further include a process of shifting the second wafer aligned with the donor substrate based on the reference member before the process of transferring the plurality of second LEDs to the donor substrate, and a process of shifting the third wafer aligned with the donor substrate based on the reference member before the process of transferring the plurality of third LEDs to the donor substrate.

The plurality of first LEDs, the plurality of second LEDs, and the plurality of third LEDs disposed on the donor substrate may be disposed at a first interval.

The second wafer may be shifted by a first interval and the third wafer may be shifted by a second interval, which is larger than the first interval, in the same direction as the shifted direction of the second wafer, and the plurality of second LEDs may be transferred to one side of the plurality of first LEDs, respectively, and the plurality of third LEDs may be transferred to one side of the plurality of second LEDs, respectively, on the donor substrate.

The second wafer may be shifted by a first interval and the third wafer may be shifted by the first interval in a direction opposite to the shifted direction of the second wafer, and the plurality of second LEDs may be transferred to one side of the plurality of first LEDs, respectively, and the plurality of third LEDs may be transferred to the other side of the plurality of first LEDs, respectively, on the donor substrate.

The method of manufacturing a display device may further include a process of aligning the donor substrate on which the plurality of first LEDs, the plurality of second LEDs, and the plurality of third LEDs are disposed with a display panel based on the reference member, and a process of transferring the plurality of first LEDs, the plurality of second LEDs, and the plurality of third LEDs disposed on the donor substrate to the display panel.

The reference member may be at least one of the plurality of first LEDs transferred onto the donor substrate.

The reference member may be a second alignment key transferred to the donor substrate together with the plurality of first LEDs among the plurality of alignment keys disposed on the first wafer.

In the process of aligning the second wafer with the donor substrate, the second wafer may be aligned with the donor substrate based on at least one of the plurality of second LEDs of the second wafer and the reference member.

In the process of aligning the second wafer with the donor substrate, the second wafer may be aligned with the donor substrate based on at least one of a plurality of alignment keys of the second wafer and the reference member.

According to another aspect of the present disclosure, there is a method of manufacturing a display device. The method of manufacturing a display device includes a process of aligning a first wafer on which a reference member and a plurality of first LEDs are disposed with a donor substrate, a process of transferring the plurality of first LEDs and the reference member of the first wafer to the donor substrate, a process of aligning a second wafer on which a plurality of second LEDs is disposed with the donor substrate based on the reference member transferred onto the donor substrate, a process of transferring the plurality of second LEDs of the second wafer to the donor substrate, a process of aligning a third wafer on which a plurality of third LEDs is disposed with the donor substrate based on the reference member transferred onto the donor substrate, and a process of transferring the plurality of third LEDs of the third wafer to the donor substrate.

The reference member may be one of the plurality of first LEDs.

A plurality of alignment keys disposed on the first wafer together with the plurality of first LEDs may be further included, the plurality of alignment keys may include a first alignment key aligned with an alignment protrusion of the donor substrate and a second alignment key which is the reference member, and the first alignment key may have a different size from the second alignment key.

A first LED disposed at a shortest distance from the second alignment key among the plurality of first LEDs may have a constant interval from the second alignment key.

In the process of transferring the plurality of second LEDs to the donor substrate, the second wafer may be shifted and then the plurality of second LEDs may be transferred, and in the process of transferring the plurality of third LEDs to the donor substrate, the third wafer may be shifted by a different interval or in a different direction from the second wafer and then the plurality of third LEDs may be transferred.

In the process of aligning the second wafer with the donor substrate, a relative position between the plurality of first LEDs disposed on the donor substrate and the plurality of second LEDs disposed on the second wafer may be aligned, and in the process of aligning the third wafer with the donor substrate, a relative position between the plurality of first LEDs and the plurality of second LEDs disposed on the donor substrate and the plurality of third LEDs disposed on the third wafer may be aligned.

The method of manufacturing a display device may further include a process of aligning the donor substrate on which the plurality of first LEDs, the plurality of second LEDs, and the plurality of third LEDs are disposed with a display panel based on the reference member transferred onto the donor substrate, and a process of transferring each of the plurality of first LEDs, the plurality of second LEDs, and the plurality of third LEDs on the donor substrate to the display panel so as to correspond to each of a first sub-pixel, a second sub-pixel, and a third sub-pixel of the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A method of manufacturing a display device, the method comprising:
    aligning a first wafer on which a plurality of first light emitting diodes (LEDs), a plurality of alignment keys, and a reference member are disposed with a donor substrate;
    transferring the plurality of first LEDs and the reference member on the first wafer to the donor substrate; and
    aligning a second wafer on which a plurality of second LEDs is disposed with the donor substrate based on the reference member,
    wherein in the aligning the first wafer with the donor substrate, the first wafer is aligned with the donor substrate based on a first alignment key among the plurality of alignment keys of the first wafer and a first alignment protrusion of the donor substrate.

2. The method of manufacturing a display device of claim 1, further comprising:
    transferring the plurality of second LEDs on the second wafer to the donor substrate on which the plurality of first LEDs is disposed;
    aligning a third wafer on which a plurality of third LEDs is disposed with the donor substrate based on the reference member; and
    transferring the plurality of third LEDs on the third wafer to the donor substrate on which the plurality of first LEDs and the plurality of second LEDs are disposed.

3. The method of manufacturing a display device of claim 2, further comprising:
    shifting the second wafer aligned with the donor substrate based on the reference member before the transferring the plurality of second LEDs to the donor substrate; and
    shifting the third wafer aligned with the donor substrate based on the reference member before the transferring the plurality of third LEDs to the donor substrate.

4. The method of manufacturing a display device of claim 3, wherein the plurality of first LEDs, the plurality of second LEDs, and the plurality of third LEDs disposed on the donor substrate are disposed at a first interval which is an interval between one of the plurality of first LEDs and one of the plurality of second LEDs.

5. The method of manufacturing a display device of claim 4, wherein the second wafer is shifted by the first interval and the third wafer is shifted by a second interval, which is larger than the first interval, in a same direction as the shifted direction of the second wafer, and the plurality of second LEDs is transferred to one side of the plurality of first LEDs, respectively, and the plurality of third LEDs is transferred to one side of the plurality of second LEDs, respectively, on the donor substrate.

6. The method of manufacturing a display device of claim 4, wherein the second wafer is shifted by the first interval and the third wafer is shifted by the first interval in a direction opposite to the shifted direction of the second wafer, and the plurality of second LEDs is transferred to one side of the plurality of first LEDs, respectively, and the plurality of third LEDs is transferred to another side of the plurality of first LEDs, respectively, on the donor substrate.

7. The method of manufacturing a display device of claim 2, further comprising:

aligning the donor substrate on which the plurality of first LEDs, the plurality of second LEDs, and the plurality of third LEDs are disposed with a display panel based on the reference member; and transferring the plurality of first LEDs, the plurality of second LEDs, and the plurality of third LEDs disposed on the donor substrate to the display panel.

8. The method of manufacturing a display device of claim 1, wherein the reference member is at least one of the plurality of first LEDs transferred onto the donor substrate.

9. The method of manufacturing a display device of claim 1, wherein the reference member is a second alignment key transferred to the donor substrate together with the plurality of first LEDs among the plurality of alignment keys disposed on the first wafer.

10. The method of manufacturing a display device of claim 1, wherein in the aligning the second wafer with the donor substrate, the second wafer is aligned with the donor substrate based on at least one of the plurality of second LEDs of the second wafer and the reference member.

11. The method of manufacturing a display device of claim 1, wherein in the aligning the second wafer with the donor substrate, the second wafer is aligned with the donor substrate based on at least one of a plurality of alignment keys of the second wafer and the reference member.

12. A method of manufacturing a display device, the method comprising:

aligning a first wafer on which a reference member and a plurality of first light emitting diodes (LEDs) are disposed with a donor substrate;

transferring the plurality of first LEDs and the reference member of the first wafer to the donor substrate;

aligning a second wafer on which a plurality of second LEDs is disposed with the donor substrate based on the reference member transferred onto the donor substrate;

transferring the plurality of second LEDs of the second wafer to the donor substrate;

aligning a third wafer on which a plurality of third LEDs is disposed with the donor substrate based on the reference member transferred onto the donor substrate; and transferring the plurality of third LEDs of the third wafer to the donor substrate, wherein a plurality of alignment keys is disposed on the first wafer together with the plurality of first LEDs, the plurality of alignment keys includes a first alignment key aligned with an alignment protrusion of the donor substrate and a second alignment key which is the reference member, and the first alignment key has a different size from the second alignment key.

13. The method of manufacturing a display device of claim 12, wherein the reference member is one of the plurality of first LEDs.

14. The method of manufacturing a display device of claim 13, wherein a first LED disposed at a shortest distance from the second alignment key, among the plurality of first LEDs, has a constant interval from the second alignment key.

15. The method of manufacturing a display device of claim 12, wherein in the transferring the plurality of second LEDs to the donor substrate, the second wafer is shifted by a first interval and then the plurality of second LEDs is transferred, wherein in the transferring the plurality of third LEDs to the donor substrate, the third wafer is shifted by a different interval which is larger than the first interval or in a different direction from the second wafer and then the plurality of third LEDs is transferred, and wherein the first interval is an interval between one of the plurality of first LEDs and one of the plurality of second LEDs.

16. The method of manufacturing a display device of claim 12, wherein in the aligning the second wafer with the donor substrate, a relative position between the plurality of first LEDs disposed on the donor substrate and the plurality of second LEDs disposed on the second wafer is aligned, and in the aligning the third wafer with the donor substrate, a relative position between the plurality of first LEDs and the plurality of second LEDs disposed on the donor substrate and the plurality of third LEDs disposed on the third wafer is aligned.

17. The method of manufacturing a display device of claim 12, further comprising:

aligning the donor substrate on which the plurality of first LEDs, the plurality of second LEDs, and the plurality of third LEDs are disposed with a display panel based on the reference member transferred onto the donor substrate; and transferring each of the plurality of first LEDs, the plurality of second LEDs, and the plurality of third LEDs on the donor substrate to the display panel so as to correspond to each of a first sub-pixel, a second sub-pixel, and a third sub-pixel of the display panel.

\* \* \* \* \*